United States Patent
Chang

(10) Patent No.: US 12,154,869 B2
(45) Date of Patent: Nov. 26, 2024

(54) SEMICONDUCTOR PACKAGE WITH HIGH DENSITY OF THROUGH-SILICON VIAS (TSV)

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 307 days.

(21) Appl. No.: 17/702,765

(22) Filed: Mar. 23, 2022

(65) Prior Publication Data
US 2023/0307384 A1 Sep. 28, 2023

(51) Int. Cl.
*H01L 23/58* (2006.01)
*H01L 23/00* (2006.01)
*H01L 23/498* (2006.01)

(52) U.S. Cl.
CPC ...... *H01L 23/585* (2013.01); *H01L 23/49822* (2013.01); *H01L 23/49827* (2013.01); *H01L 24/08* (2013.01); *H01L 2224/08225* (2013.01)

(58) Field of Classification Search
CPC ............. H01L 23/585; H01L 23/49822; H01L 23/49827; H01L 24/08
See application file for complete search history.

(56) References Cited

U.S. PATENT DOCUMENTS

| | | | |
|---|---|---|---|
| 11,362,065 B2* | 6/2022 | Chen | H01L 28/60 |
| 11,699,638 B2* | 7/2023 | Chen | H01L 25/0657 257/774 |
| 2010/0130003 A1* | 5/2010 | Lin | H01L 25/50 257/E21.159 |
| 2010/0187671 A1* | 7/2010 | Lin | H01L 21/76898 257/773 |
| 2011/0037528 A1* | 2/2011 | Guo | H05K 1/0219 438/106 |

(Continued)

FOREIGN PATENT DOCUMENTS

TW 201401380 A 1/2014

OTHER PUBLICATIONS

First office action received in the counterpart Taiwan application 112105399, mailed on Dec. 22, 2023.

*Primary Examiner* — Nathan W Ha
(74) *Attorney, Agent, or Firm* — Kilpatrick Townsend & Stockton LLP

(57) ABSTRACT

A semiconductor die is provided. The semiconductor die includes: a silicon substrate; a bonding layer formed at a back side of the silicon substrate and including a first metal pad; a multi-layer interconnect (MLI) structure formed at a front side of the silicon substrate; a first through-silicon via (TSV) penetrating the silicon substrate and at least a portion of the MLI structure in a vertical direction, wherein a first end of the first TSV is in contact with and electrically connected to the first metal pad, and a second end of the first TSV is electrically connected to a first metal track located in the MLI structure; and a first guard ring formed in the MLI structure, wherein the first guard ring extends in the vertical direction and surrounds the first TSV, and the first guard ring is electrically connected to the first metal track.

20 Claims, 15 Drawing Sheets

(56) References Cited

U.S. PATENT DOCUMENTS

| | | | |
|---|---|---|---|
| 2011/0266679 A1* | 11/2011 | Hotta | H01L 23/585 |
| | | | 257/E21.585 |
| 2012/0112322 A1 | 5/2012 | Lin et al. | |
| 2016/0035639 A1* | 2/2016 | Wu | H01L 23/3114 |
| | | | 438/114 |
| 2016/0079166 A1* | 3/2016 | Farooq | H01L 23/481 |
| | | | 257/529 |
| 2019/0279996 A1* | 9/2019 | Yamashita | H01L 27/0688 |
| 2021/0082857 A1* | 3/2021 | Chen | H01L 23/5386 |
| 2022/0262771 A1* | 8/2022 | Chen | H01L 23/481 |
| 2023/0076238 A1* | 3/2023 | Kim | H01L 21/76898 |
| 2023/0217651 A1* | 7/2023 | Eom | H10B 43/40 |
| | | | 257/314 |
| 2023/0298973 A1* | 9/2023 | Chen | H01L 21/6835 |
| | | | 257/774 |
| 2023/0377949 A1* | 11/2023 | Syue | H01L 24/24 |
| 2024/0006356 A1* | 1/2024 | Hwang | H01L 25/18 |

* cited by examiner

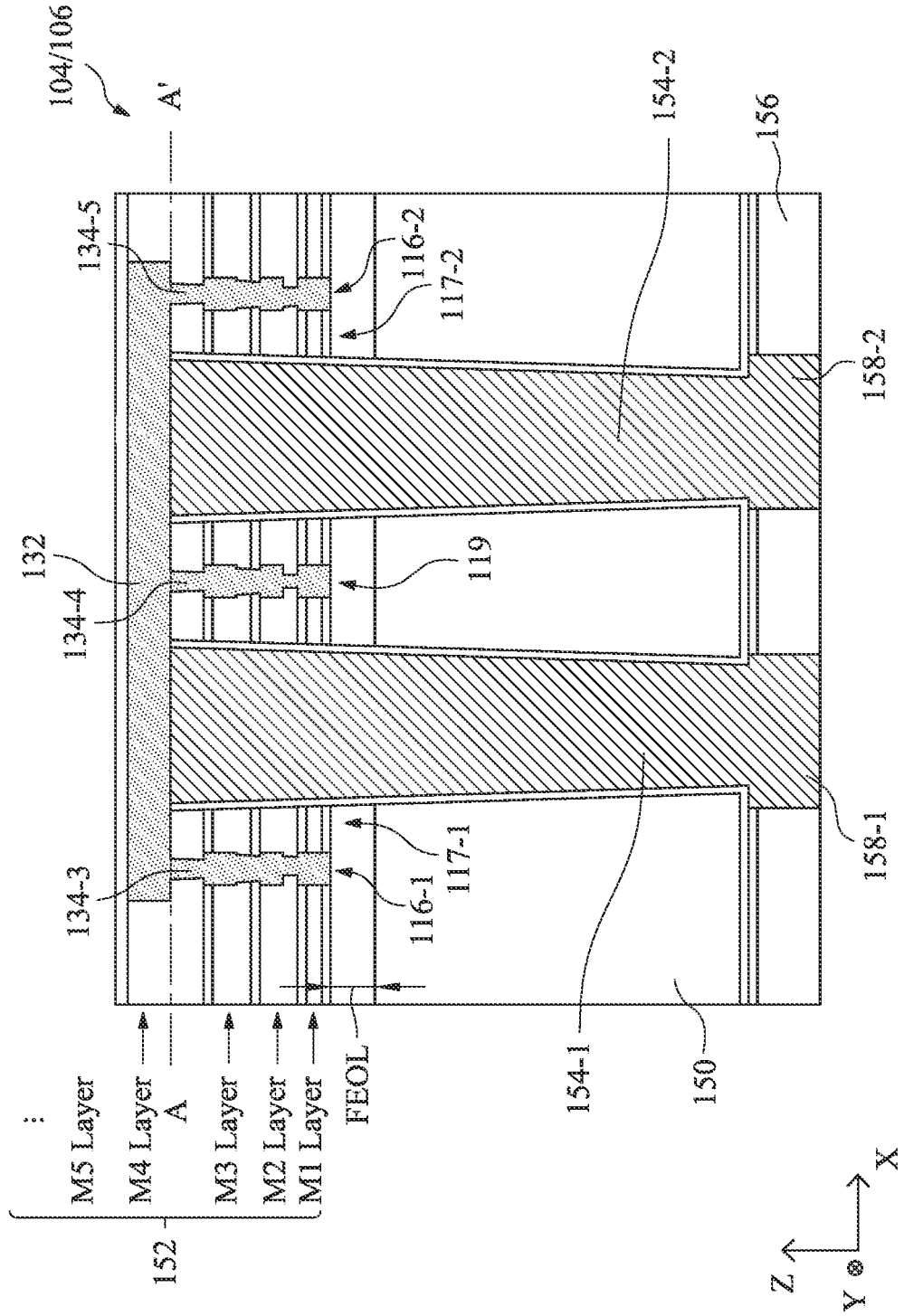

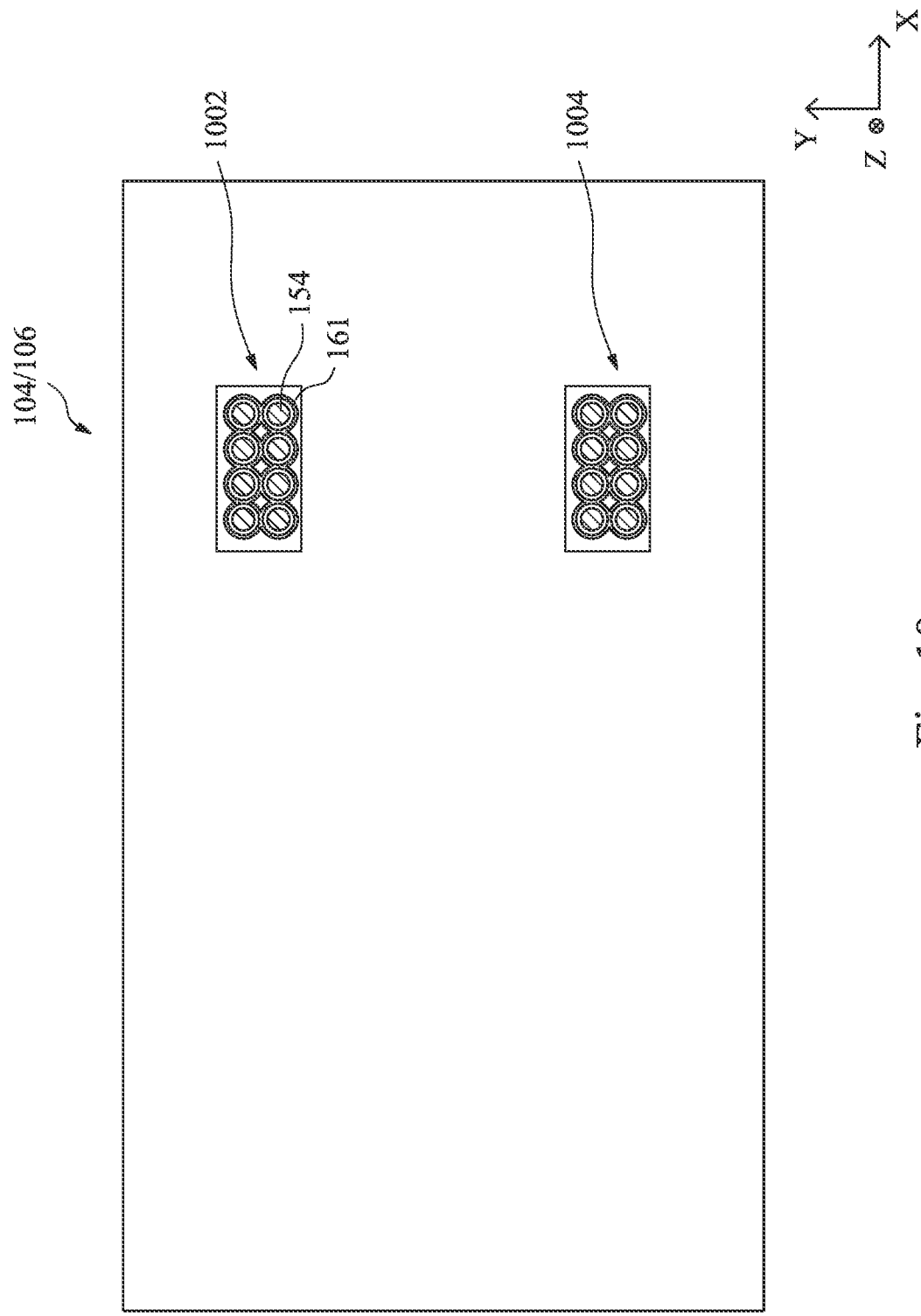

SEMICONDUCTOR PACKAGE WITH HIGH DENSITY OF THROUGH-SILICON VIAS (TSV)

FIELD

Embodiments of the present disclosure relate generally to semiconductor packaging, and more particularly to semiconductor packages with high density of through-silicon vias (TSVs).

BACKGROUND

In recent years, the semiconductor industry has experienced rapid growth due to continuous improvement in the integration density of a variety of electronic components (e.g., transistors, diodes, resistors, capacitors, etc.). For the most part, improvement in integration density has resulted from iterative reduction of minimum feature size, which allows more components to be integrated into a given area.

These continuously scaled electronic components require smaller packages that occupy less area than previous packages. Exemplary types of packages include quad flat pack (QFP), pin grid array (PGA), ball grid array (BGA), flip chips (FC), three-dimensional integrated circuits (3D ICs), wafer-level packages (WLPs), and package on package (PoP) devices. For instance, front-end 3D inter-chip stacking technologies are used for re-integration of chiplets partitioned from System on Chip (SoC). The resulting integrated chip outperforms the original SoC in system performance. It also affords the flexibility to integrate additional system functionalities. Advantages of those advanced packaging technologies like 3D inter-chip stacking technologies include improved integration density, faster speeds, and higher bandwidth because of the decreased length of interconnects between the stacked chips. However, there are quite a few challenges to be handled for the technologies of advanced packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9A is a cross-sectional diagram illustrating an example guard ring design in accordance with some embodiments.

FIG. 10 is a diagram illustrating an example guard ring design in accordance with some embodiments.

DETAILED DESCRIPTION OF THE INVENTION

Figure 1:
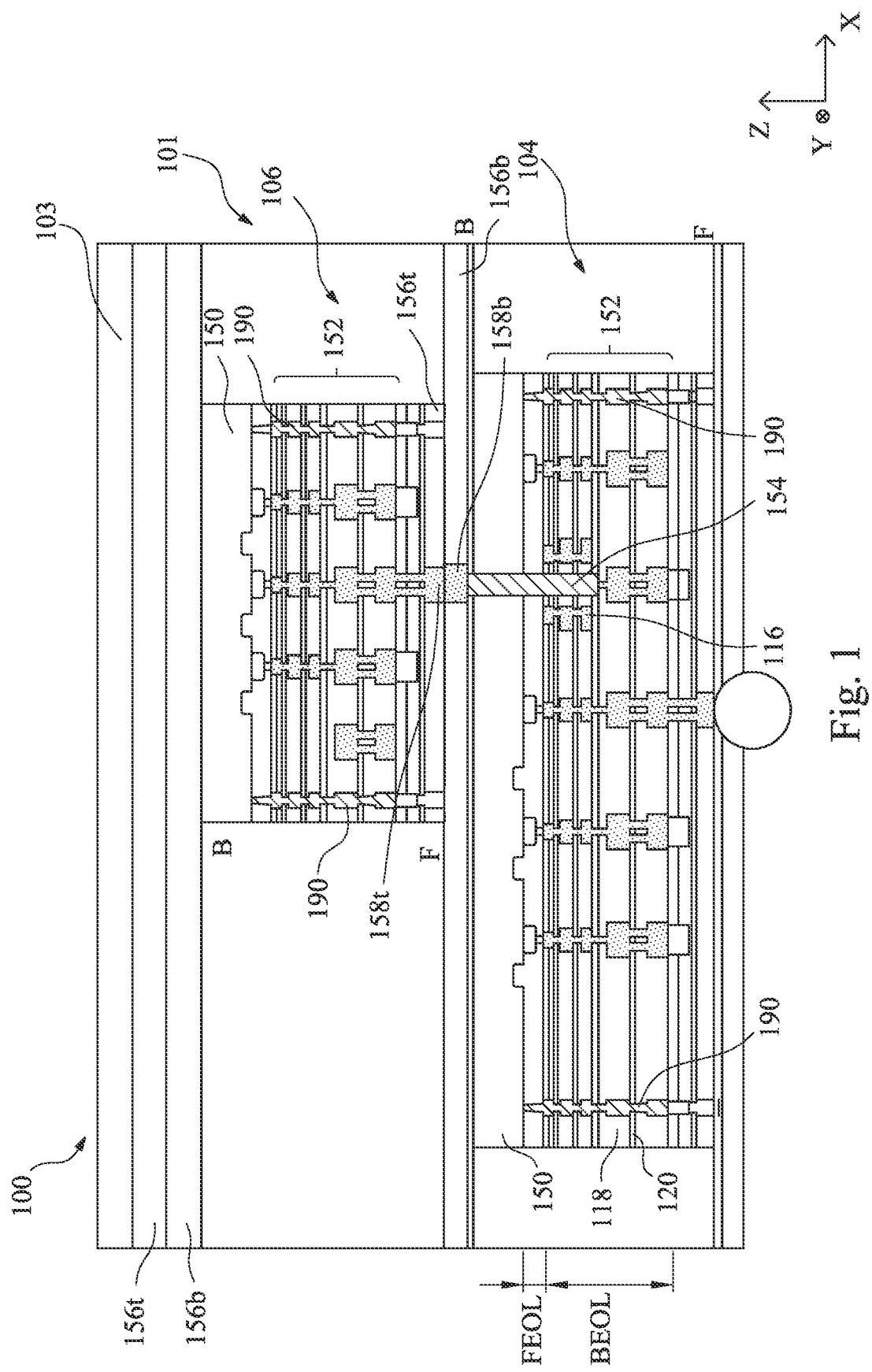
FIG. 1 is a cross-sectional diagram illustrating an example semiconductor package 100 in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Packaging technologies were once considered just back-end processes, almost an inconvenience. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Chip-on-Wafer-on-Substrate (CoWoS) is a wafer-level multi-chip packaging technology often used in conjunction with hybrid bonding. CoWoS is a packaging technology that incorporates multiple chips side-by-side on a silicon interposer in order to achieve better interconnect density and performance. Individual chips are bonded through, for example, micro-bumps on a silicon interposer, forming a chip-on-wafer (CoW) structure. The CoW structure is then subsequently thinner such that through-silicon-vias (TSVs) are exposed, which is followed by the formation of bumps (e.g., C4 bumps) and singulation. The CoW structure is then bonded to a package substrate forming the CoWoS structure. Since multiple chips or dies are generally incorporated in a side-by-side manner, the CoWoS is considered a 2.5-dimensional (2.5D) wafer-level packaging technology.

On the other hand, those multiple chips that are bonded to the interposer in a CoWoS structure can each include stacking dies or chiplets (i.e., modular dies), with multi-layers, multi-chip sizes, and multi-functions. In one implementation, the stacking dies are bonded together using hybrid bonding (HB). Hybrid bonding is a process that stacks and bonds dies using both dielectric bonding layers and metal-to-metal interconnects in advanced packaging. The metal pads at the interface of the hybrid bonding may be electrically connected to semiconductor devices or components in the dies via through-silicon vias (TSVs). Since no bumps like micro-bumps are used, hybrid bonding is regarded as a bumpless bonding technique. Hybrid bonding can provide improved integration density, faster speeds, and higher bandwidth. In addition to die-to-die bonding, hybrid bonding can also be used for wafer-to-wafer bonding and die-to-wafer bonding. In another implementation, the stacking dies are bonded together using fusion bonding.

Stacking dies featuring bumpless ultra-high-density-vertical stacking (often using hybrid bonding) is sometimes referred to System on Integrated Chips (SoIC) technologies. SoIC technologies can achieve high performance, low power, and minimum resistance-inductance-capacitance (RLC). SoIC technologies integrate active and passive chips that are partitioned from System on Chip (SoC), into a new integrated SoC system, which is electrically identical to native SoC, to achieve better form factor and performance. A die stack bonded together using hybrid bonding is sometimes, therefore, referred to as a SoIC die stack ("SoIC die stack" and "die stack" are used interchangeably throughout the disclosure).

One bottleneck of hybrid bonding in a SoIC die stack is the TSV density. If the critical dimension of a TSV is too small, the overlay between the two dies to be bonded would cause the misalignment of the metal pads located in the bonding layers. In addition, if the critical dimension of a TSV is too small, the trench cannot be deep enough to penetrate through the entire silicon substrate at the backside due to the aspect ratio restriction of the etching process. The buffer ring between a TSV and its surrounding guard ring also limits the TSV density. In summary, due to the overlay between the two dies, the aspect ratio of the etching process, and the buffer ring surrounding the TSV, TSV density remains a bottleneck of hybrid bonding in a SoIC die stack.

In accordance with some embodiments of the present disclosure, semiconductor packages are provided. A first TSV penetrates a silicon substrate of a die in a vertical direction, a first end of the first TSV is in contact with and electrically connected to a first hybrid bonding metal pad, and a second end of the first TSV is electrically connected to a metal track located in a multi-layer interconnect (MLI) structure. A first guard ring is formed in the MLI structure and extends in the vertical direction and surrounds the first TSV. Likewise, a second TSV penetrates the silicon substrate in the vertical direction, a first end of the second TSV is in contact with and electrically connected to a second hybrid bonding metal pad, and a second end of the second TSV is electrically connected to the metal track. A second guard ring is formed in the MLI structure and extends in the vertical direction and surrounds the first TSV. The first guard ring and the second guard ring have a shared region. As such, TSV pitch is minimized, therefore achieving a high TSV density.

In accordance with some embodiments of the present disclosure, the first guard ring and the second guard ring are electrically connected to the metal track. As the first TSV and the first guard ring are both electrically connected to the metal track, the potential of the first TSV is the same as the potential of the first guard ring, eliminating the inductive capacitance between the first TSV and the first guard ring. Various embodiments and variations will be described below with reference to FIGS. 1-10.

FIG. 1 is a cross-sectional diagram illustrating an example semiconductor package 100 in accordance with some embodiments. In the example shown in FIG. 1, the semiconductor package 100 includes, among other things, an SoIC die stack 101. Thus, the semiconductor package 100 is an SoIC package. The SoIC die stack 101 includes a bottom die 104 and a top die 106. The bottom die 104 has a front side (denoted as "F" in FIG. 1) and a back side (denoted as "B" in FIG. 1). In the example shown in FIG. 1, the bottom die 204 has been flipped, i.e., upside down. The top die 106 has a front side (denoted as "F" in FIG. 1) and a back side (denoted as "B" in FIG. 1). In the example shown in FIG. 1, the top die 206 has been flipped, i.e., upside down. The front side of the top die 106 is bonded to the back side of the bottom die 104 using hybrid bonding in the example shown in FIG. 1, details of which will be described below. It should be understood that although a front-to-back configuration (i.e., a front side of one die is bonded to a back side of another die), the techniques described herein are also applicable to other configurations such as a front-to-front configuration (i.e., a front side of one die is bonded to a front side of another die).

In the example shown in FIG. 1, the back side of the top die 106 is bonded to a carrier wafer 103, which has been processed using thinning processes (e.g., silicon grinding) and planarization processes (e.g., chemical-mechanical polishing (CMP)).

A bonding layer 156*b* ("b" stands for "bottom") is formed at the back side and on a silicon substrate 150 of the bottom die 104. In one implementation, the bonding layer 156*b* is made of a dielectric and can be used for bonding with another bonding layer 156*t* ("t" stands for "top") at the front side and the bottom surface of the top die 106. The bonding layer 156*b* and the bonding layer 156*t* are configured to bond the bottom die 104 and the top die 106. In one implementation, the bonding layers 156*b* and 156*t* are made of silicon dioxide. In another implementation, the bonding layers 156*b* and 156*t* are made of silicon oxynitride. It should be understood that these examples are not intended to be limiting and other dielectric materials may be employed in other examples.

One or more semiconductor devices (e.g., transistors, resistors, capacitors, inductors, etc.) are formed on the silicon substrate 150, before being flipped, in a front-end-of-line (FEOL) process. A multilayer interconnect (MLI) structure 152 is disposed over the one or more semiconductor devices, before being flipped. The MLI structure 152 includes a combination of dielectric layers 118 and conductive layers disposed in the dielectric layers and configured to form various interconnect structures. The conductive layers are configured to form vertical interconnect features (e.g., device-level contacts, vias, etc.) and horizontal interconnect features (e.g., conductive lines extending in a horizontal plane). Vertical interconnect features typically connect horizontal interconnect features in different layers (e.g., a first metal layer often denoted as "M1" and a fifth metal layer often denoted as "M5") of the MLI structure 152. During operation of the bottom die 104, the interconnect structures are configured to route signals and/or distribute signals (e.g., clock signals, voltage signals, ground signals) to the one or more semiconductor devices to fulfill certain functions. It should be understood that although the MLI structure 152 is depicted in FIG. 1 with a given number of dielectric layers 118 and conductive layers, the present disclosure contemplates MLI structures having more or fewer dielectric layers and/or conductive layers depending on design requirements of the bottom die 104.

In the example shown in FIG. 1, each of the dielectric layers 118 includes at least one of a polymer, an oxide, polybenzobisoxazole (PBO), a polyimide (PI), a metal nitride, silicon, germanium, carbide, gallium, arsenide, germanium, arsenic, indium, silicon oxide, sapphire, or other suitable materials. In some implementations, the dielectric layers 118 are formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques. In some embodiments, at least one of the dielectric layers 118 includes an extreme low-κ (ELK) dielectric (relative to silicon dioxide) having a dielectric constant of about 2.6 or less.

In the example shown in FIG. 1, the MLI structure 152 includes multiple etch stop layers 120 between adjacent dielectric layers. In some implementations, an etch stop layer 120 has a different etch selectivity relative to an overlying or adjacent layer such that when an etchant etches through the overlying layer the etching process slows or stops upon the etchant encountering the underlying etch stop layer 120. In some embodiments, an etch stop layer 120 comprises silicon, carbon, or other suitable materials. In some embodiments, at least some different etch stop layers 120 have different compositions, such as due to the use of different etchants to etch different materials.

In the example shown in FIG. 1, the bottom die 104 includes a hybrid bonding metal pad 158*b* formed in the bonding layer 156*b*, and the hybrid bonding metal pad 158*b* is connected to the MLI structure 152 through a through-silicon via (TSV) 154, which penetrates the silicon substrate 150 in the vertical direction (i.e., the Z-direction). It should be understood that although only one hybrid bonding metal pad 158*b* and only one TSV 154 is shown in FIG. 1, this is not intended to be limiting. In other examples, there are many hybrid bonding metal pads 158*b* and corresponding TSVs 154, with small critical dimensions and pitches, thus achieving better interconnect density and performance (e.g., faster speeds, higher bandwidth, and the like). In one implementation, the hybrid bonding metal pad 158*b* is made of copper.

A guard ring 116 extends in the Z-direction and surrounds the TSV 154 in the X-Y plane. In some embodiment, the guard ring 116 prevents water or vapor pollution of the dielectric layer 118 during the fabrication of the TSV 154. In some embodiments, the guard ring 116 protects, shields, electrically isolates, etc. the TSV 154. In some embodiments, the guard ring 116 provides support, reinforcement, structural integrity, etc. for the TSV 154. Details of the guard ring 116 and the TSV 154 will be described below with reference to FIGS. 2A-2B.

A seal ring 190 is a metallization structure that is located between and separates the core circuitry of the bottom die 104 and the peripheral regions (or edges) of the bottom die 104. The seal ring 190 surrounds the core circuitry in the X-Y plane and prevents the intrusion of cracks and moisture penetration or chemical damage like acid, alkaline containing or diffusion of contaminating species.

Likewise, the top die 106 has a bonding layer 156*t* ("t" stands for "top") formed at the front side and the bottom surface and over a MLI structure 152, before the top die 106 is flipped. In one implementation, the bonding layer 156*t* is made of a dielectric and can be used for bonding with the bonding layer 156*b* at the bottom die 104, as mentioned above. Likewise, the top die 106 includes a hybrid bonding metal pad 158*t* ("t" stands for "top") formed in the bonding layer 156*t*, and the hybrid bonding metal pad 158*t* is connected to the MLI structure 152 through, for example, a via. It should be understood that although only one hybrid bonding metal pad 158*t* is shown in FIG. 1, this is not intended to be limiting. In other examples, there are many hybrid bonding metal pads 158*t*, with small critical dimensions and pitches, thus achieving better interconnect density and performance (e.g., faster speeds, higher bandwidth, and the like). In one implementation, the hybrid bonding metal pad 158*t* is made of copper. As such, a copper-to-copper interconnect is formed between the bottom die 104 and the top die 106 using the hybrid bonding metal pads 158*b* and 158*t*. Although only one electrical path comprised of the hybrid bonding metal pads 158*t* and 158*b* and the TSV 154 is illustrated in FIG. 1, one skilled in the art should appreciate that there may be a number of electrical paths between the bottom die 104 and the top die 106 in other examples. As explained above, the high density of the TSV 154, therefore the high density of the electrical paths, results in the advantages such as faster speeds and higher bandwidth. Examples of various designs that can achieve high TSV densities will be described in detail with reference to FIGS. 2A-10.

Likewise, one or more semiconductor devices (e.g., transistors, resistors, capacitors, inductors, etc.) are formed on the silicon substrate 150, before being flipped, in a front-end-of-line (FEOL) process. The MLI structure 152 is disposed over the one or more semiconductor devices, before being flipped. Similarly, a seal ring 190 is located between and separates the core circuitry of the top die 106 and the peripheral regions (or edges) of the top die 106. The seal ring 190 surrounds the core circuitry in the X-Y plane and prevents the intrusion of cracks and moisture penetration or chemical damage like acid, alkaline containing or diffusion of contaminating species.

For die-to-die boding, back-end processes, such as dicing, die handling, and die transport on film frame, have to be adapted to front-end clean levels, allowing high bonding yields on a die level. For example, copper hybrid bonding is conducted in a cleanroom in a wafer fab, instead of in an outsourced semiconductor assembly and test (OSAT) facility. Pick-and-place systems are often used to handle dies in the context of die-to-die boding or die-to-wafer boding. A pick-and-place system is an automatic system that can pick a top die and place it onto the bottom die or a host wafer, often in a high-speed manner.

Figure 2A:
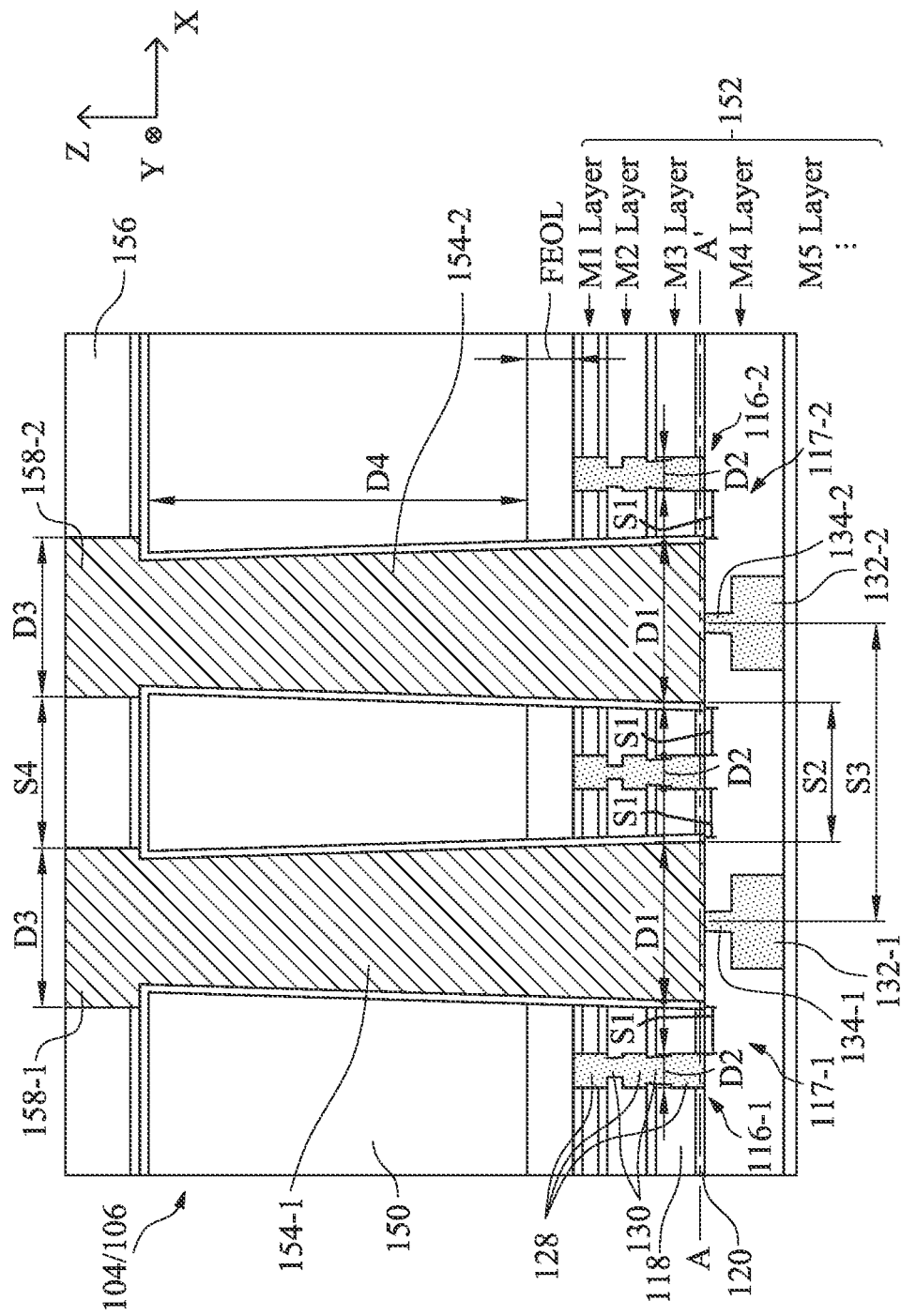
FIG. 2A is a cross-sectional diagram illustrating an example guard ring design in accordance with some embodiments.
Figure 2B:
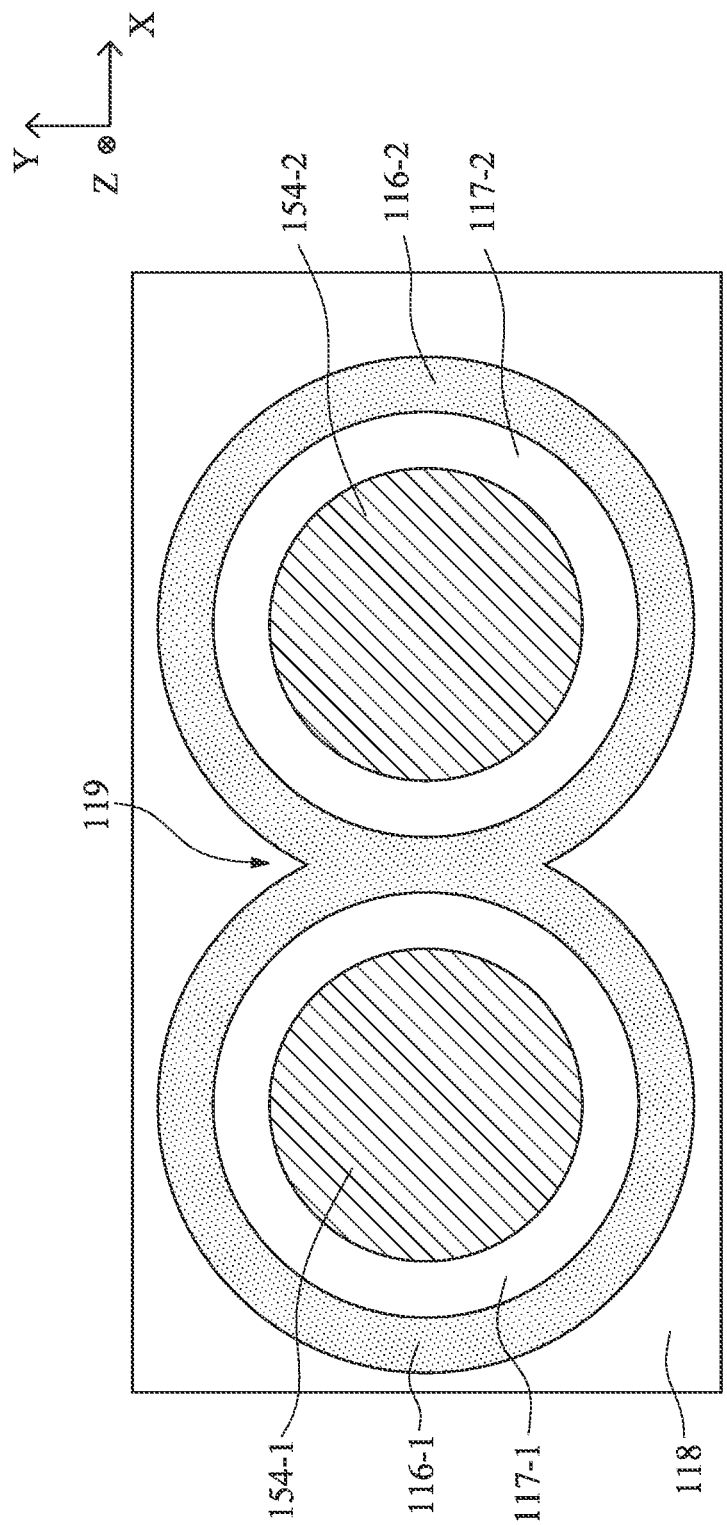
FIG. 2B is a cross-sectional diagram illustrating the example guard ring design of FIG. 2A at a horizontal plane in accordance with some embodiments.

FIG. 2A is a cross-sectional diagram illustrating an example guard ring design in accordance with some embodiments. FIG. 2B is a cross-sectional diagram illustrating the example guard ring design of FIG. 2A at a horizontal plane in accordance with some embodiments. It should be understood that FIGS. 2A-2B are illustrative and not drawn to scale.

As shown in FIG. 2A, a first TSV 154-1 and a second TSV 154-2 are formed in a bottom die 104 or a top die 106. The first TSV 154-1 and the second TSV 154-2 penetrate the silicon substrate 150 and a portion of an MLI structure 152 in the vertical direction (i.e., the Z-direction). One end of the first TSV 154-1 is in contact with and electrically connected to a hybrid bonding metal pad 158-1 in a bonding layer 156 formed at the backside of the silicon substrate 150, the other end of the first TSV 154-1 is in contact with and electrically connected to a via 134-1 formed in the fourth metal layer (i.e., the "M4 layer"). The via 134-1 is further in contact with and electrically connected to a metal track 132-1 formed in the M4 layer.

Similarly, One end of the second TSV 154-2 is in contact with and electrically connected to a hybrid bonding metal pad 158-2 in the bonding layer 156, the other end of the second TSV 154-2 is in contact with and electrically connected to a via 134-2 formed in the M4 layer. The via 134-2 is further in contact with and electrically connected to a metal track 132-2 formed in the M4 layer.

A first guard ring 116-1 is formed in the first metal layer (i.e., the "M1 layer"), the second metal layer (i.e., the "M2 layer"), and the third metal layer (i.e., the "M3 layer"). The first guard ring 116-1 extends in the Z-direction and surrounds the first TSV 154-1 in the horizontal plane (i.e., the X-Y plane). The first guard ring 116-1 includes three metal tracks 128 formed in the M1 layer, the M2 layer, and the M3 layer, respectively, and two vias 130 formed between them in the Z-direction. That is, the first guard ring 116-1 includes alternating metal tracks and vias.

A second guard ring 116-2 is formed in the M1 layer, the M2 layer, and the M3 layer. The second guard ring 116-2 extends in the Z-direction and surrounds the second TSV 154-2 in the horizontal plane (i.e., the X-Y plane). Similarly, the second guard ring 116-2 includes three metal tracks 128 formed in the M1 layer, the M2 layer, and the M3 layer, respectively, and two vias 130 formed between them in the Z-direction. That is, the second guard ring 116-2 includes alternating metal tracks and vias.

In some embodiments, the metal tracks 128 and the vias 130 includes at least one of Al, Cu, Sn, Ni, Au, Ag, W, or other suitable material. In some embodiments, at least some of the metal tracks 128 have the same width in the X-direction. In some embodiments, at least some of the metal tracks 128 have different widths in the X-direction. In some embodiments, at least some of the metal tracks 128 have the same height in the Z-direction. In some embodiments, at least some of the metal tracks 128 have different heights in the Z-direction. In some embodiments, at least some of the metal tracks 128 have different compositions as compared to other metal tracks 128. In some embodiments, at least some of the vias 130 have the same width in the X-direction. In some embodiments, at least some of the vias 130 have different widths in the X-direction. In some embodiments, at least some of the vias 130 have the same height in the Z-direction. In some embodiments, at least some of the vias 130 have different heights in the Z-direction. In some embodiments, at least some of the vias 130 have different compositions as compared to other vias 130.

It should be understood that although the first TSV 154-1, the first guard ring 116-1, the second TSV 154-2, and the second guard ring 116-2 are formed in the M1 layer, the M2 layer, and the M3 layer, this is not intended to be limiting. In general, the first TSV 154-1, the first guard ring 116-1, the second TSV 154-2, and the second guard ring 116-2 can be formed in the M1 layer to the Nth metal layer (i.e., the "MN layer"), where N is a positive integer. In one example, N is equal to one. In another example, N is equal to two. In yet another example, N is equal to four. In still another example, N is equal to eight.

As shown in FIG. 2B, which illustrates a cross-section taken at a horizontal plane (denoted as A-A' in FIG. 2A), the first TSV 154-1 is surrounded by the first guard ring 116-1, while the second TSV 154-2 is surrounded by the second guard ring 116-2. The first TSV 154-1, the second TSV 154-2, the first guard ring 116-1, and the second guard ring 116-2 are located in the dielectric layer 118. The dielectric between the first TSV 154-1 and the first guard ring 116-1 is considered as a first buffer ring 117-1, while the dielectric between the second TSV 154-2 and the second guard ring 116-2 is considered as a second buffer ring 117-2. In one embodiment, the first buffer ring 117-1 and the second buffer ring 117-2 are made of an ELK dielectric (relative to silicon dioxide) having a dielectric constant of about 2.6 or less.

In the example shown in FIG. 2B, the first guard ring 116-1 and the second guard ring 116-2 are in contact with each other such that there is a shared region 119 between the first guard ring 116-1 and the second guard ring 116-2. As a result, the TSV pitch in the X-direction is minimized, therefore achieving a high TSV density.

Referring back to FIG. 2A, the critical dimension (in the X-direction) of the first TSV 154-1 and the second TSV 154-2 is D1, while the critical dimension (in the X-direction) of the first guard ring 116-1 and the second guard ring 116-2 is D2. The critical dimension D1 is a diameter of the first TSV 154-1 and the second TSV 154-2, while the critical dimension D2 is a diameter of the first guard ring 116-1 and the second guard ring 116-2. The critical dimension (in the X-direction) of the hybrid bonding metal pads 158-1 and 158-2 is D3. The thickness (in the Z-direction) of the silicon substrate 150 is D4. The width (in the X-direction) of the first buffer ring 117-1 and the second buffer ring 117-2 is S1. In other words, the distance (in the X-direction) between the first TSV 154-1 and the guard ring 116-1 or between the second TSV 154-2 and the guard ring 116-2 is S1. The distance (in the X-direction) between the first TSV 154-1 and the second TSV 154-2 is S2. In the example shown in FIGS. 2A and 2B, S2 is equal to (D2+2S1) as the first guard ring 116-1 and the second guard ring 116-2 have the shared region 119. The TSV pitch is S3, which is equal to (D1+S2). In the example shown in FIGS. 2A and 2B, the TSV pitch S3 is equal to (D1+D2+2S1) as the first guard ring 116-1 and the second guard ring 116-2 have the shared region 119. The distance (in the X-direction) between the hybrid bonding metal pads 158-1 and 158-2 is S4.

As explained above, D1 has some restrictions, such as the overlay between the two dies and the aspect ratio of the etching process and therefore cannot be too small. In one embodiment, D1 is 1 µm. In another embodiment, D1 is 0.7 µm. In yet another embodiment, D1 is 0.5 µm.

D2, on the other hand, cannot be too small. If D2 is too small, the capability for the first guard ring 116-1 and the second guard ring 116-2 of preventing water or vapor pollution of the dielectric layer 118 during the fabrication of the TSV 154 diminishes. In one embodiment, D2 is 0.25 µm. In another embodiment, D2 is 0.2 µm. In yet another embodiment, D2 is 0.15 µm. In still another embodiment, D2 is 0.13 µm.

D3 has some restrictions, such as the overlay between the two dies to be bonded together and therefore cannot be too small. In one embodiment, D3 is 1 µm. In another embodiment, D3 is 0.7 µm. In yet another embodiment, D3 is 0.5 µm.

D4 has some restrictions, such as the deep well depth of semiconductor devices fabricated on the silicon substrate 150 and therefore cannot be too thin. In one embodiment, D4 is 10 µm. In another embodiment, D4 is 5 µm. In yet another embodiment, D4 is 2.5 µm.

S1 is subject to the overlay variation between the TSV photo layer and the guard ring photo layer in the lithographic process. In one embodiment, S1 is 0.3 µm. In another embodiment, S1 is 0.2 µm. In yet another embodiment, S1 is 0.135 µm. In still another embodiment, S1 is 0.1 µm.

As explained above, in the example shown in FIGS. 2A and 2B, S2 is equal to (D2+2S1), therefore subject to the restrictions on D2 and S1. In one embodiment, S2 is equal to 0.85 µm. In another embodiment, S2 is equal to 0.6 µm. In yet another embodiment, S2 is equal to 0.4 µm.

As explained above, in the example shown in FIGS. 2A and 2B, S3 is equal to (D1+D2+2S1), therefore subject to the restrictions on D1, D2, and S1. In one embodiment, S3 is equal to 1.5 µm. In another embodiment, S3 is equal to 1 µm. In yet another embodiment, S3 is equal to 0.9 µm.

S4 is related to S3 and D3, therefore subject to the restrictions on S3 and D3. In one embodiment, S4 is equal to 0.85 µm. In another embodiment, S4 is equal to 0.6 µm. In yet another embodiment, S4 is equal to 0.4 µm.

In one embodiment, D1, D2, D4, and S1 are in accordance with the following relationships: (i) D1<0.5*D4; (ii) S1<D1; and (iii) D2<D1. That is, given a thickness D4 of the silicon substrate 150, the critical dimension D1 of the first TSV 154-1 and the second TSV 154-2 is smaller than half of the thickness of the silicon substrate 150. Also, given the critical dimension D1 of the first TSV 154-1 or the second TSV 154-2, the critical dimension S1 of the first buffer ring 117-1 and the second buffer ring 117-2 is smaller than D1. Also, given the critical dimension D1 of the first TSV 154-1 or the second TSV 154-2, the critical dimension D2 of the first guard ring 116-1 and the second guard ring 116-2 is smaller than D1.

Figure 3:
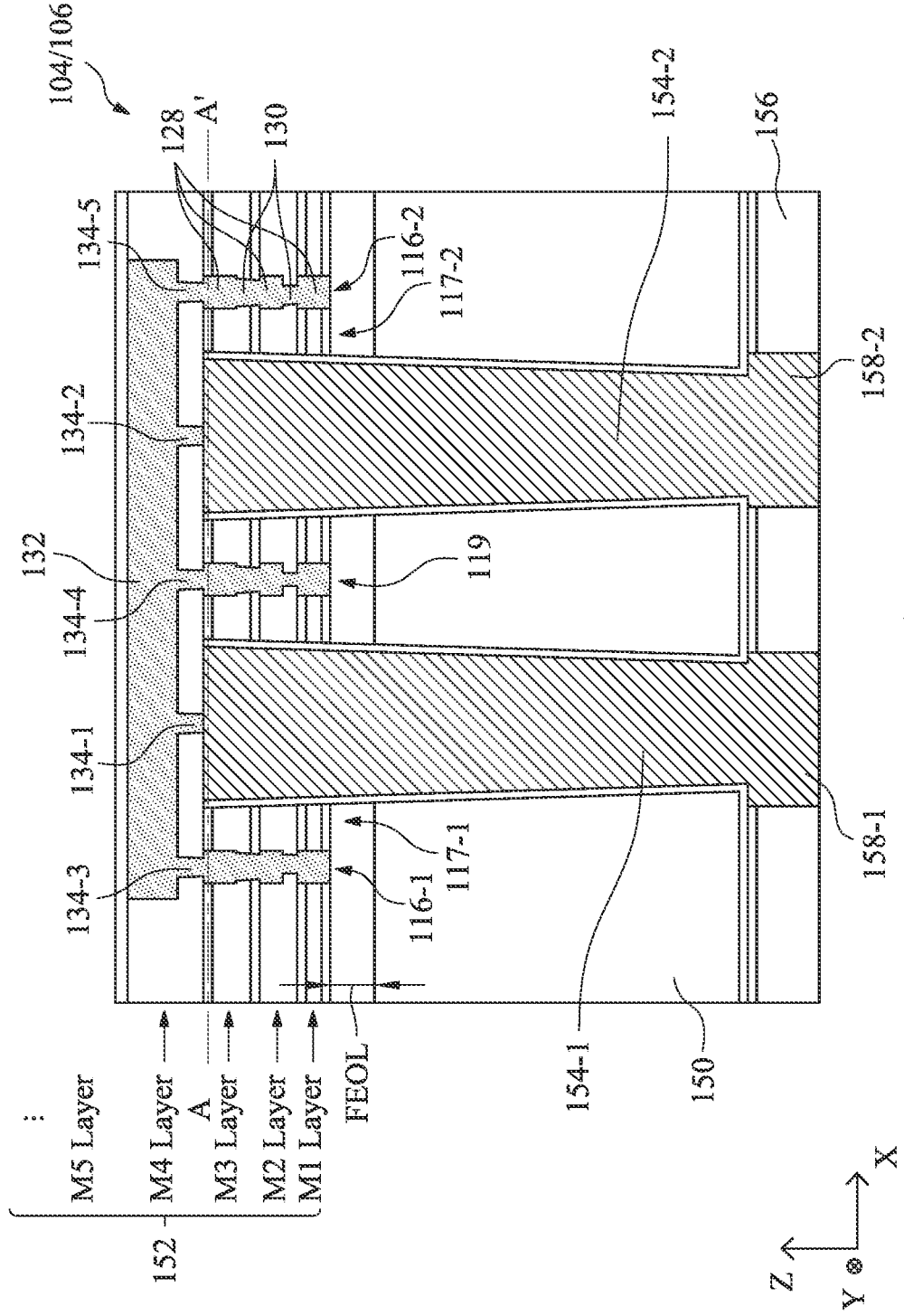
FIG. 3 is a cross-sectional diagram illustrating an example guard ring design in accordance with some embodiments.

FIG. 3 is a cross-sectional diagram illustrating an example guard ring design in accordance with some embodiments. It should be understood that FIG. 3 is illustrative and not drawn to scale.

As shown in FIG. 3, a first TSV 154-1 and a second TSV 154-2 are formed in a bottom die 104 or a top die 106. The first TSV 154-1 and the second TSV 154-2 penetrate the silicon substrate 150 and a portion of an MLI structure 152 in the vertical direction (i.e., the Z-direction). One end of the first TSV 154-1 is in contact with and electrically connected to a hybrid bonding metal pad 158-1 in a bonding layer 156 formed at the backside of the silicon substrate 150, the other end of the first TSV 154-1 is in contact with and electrically connected to a via 134-1 formed in the M4 layer. Similarly, One end of the second TSV 154-2 is in contact with and electrically connected to a hybrid bonding metal pad 158-2 in the bonding layer 156, the other end of the second TSV 154-2 is in contact with and electrically connected to a via 134-2 formed in the M4 layer.

Different from the example shown in FIG. 2A, both the via 134-1 and the via 134-2 are further in contact with and electrically connected to a metal track 132 formed in the M4 layer. In other words, the first TSV 154-1 and the second TSV 154-2 are electrically connected to the same metal track, i.e., the metal track 132.

In addition, the first guard ring 116-1 and the second guard ring 116-2 are electrically connected to the metal track 132 as well. As shown in FIG. 3, the first guard ring 116-1 and the second guard ring 116-2 are in contact with each other such that there is a shared region 119 between the first guard ring 116-1 and the second guard ring 116-2. The first guard ring 116-1 is electrically connected to the metal track 132 through a via 134-3, the second guard ring 116-2 is electrically connected to the metal track 132 through a via 134-2. The shared region 119 is electrically connected to the metal track 132 through a via 134-4.

As the first TSV 154-1 and the first guard ring 116-1 are both electrically connected to the metal track 132, the potential of the first TSV 154-1 is the same as the potential of the first guard ring 116-1, eliminating the inductive capacitance between the first TSV 154-1 and the first guard ring 116-1. Likewise, as the second TSV 154-2 and the second guard ring 116-2 are both electrically connected to the metal track 132, the potential of the second TSV 154-2 is the same as the potential of the second guard ring 116-2, eliminating the inductive capacitance between the second TSV 154-2 and the second guard ring 116-2.

It should be understood that the cross-sectional diagram taken at a horizontal plane (denoted as A-A' in FIG. 3) is similar to the cross-sectional diagram shown in FIG. 2B and therefore is not produced for conciseness.

Figure 4A:
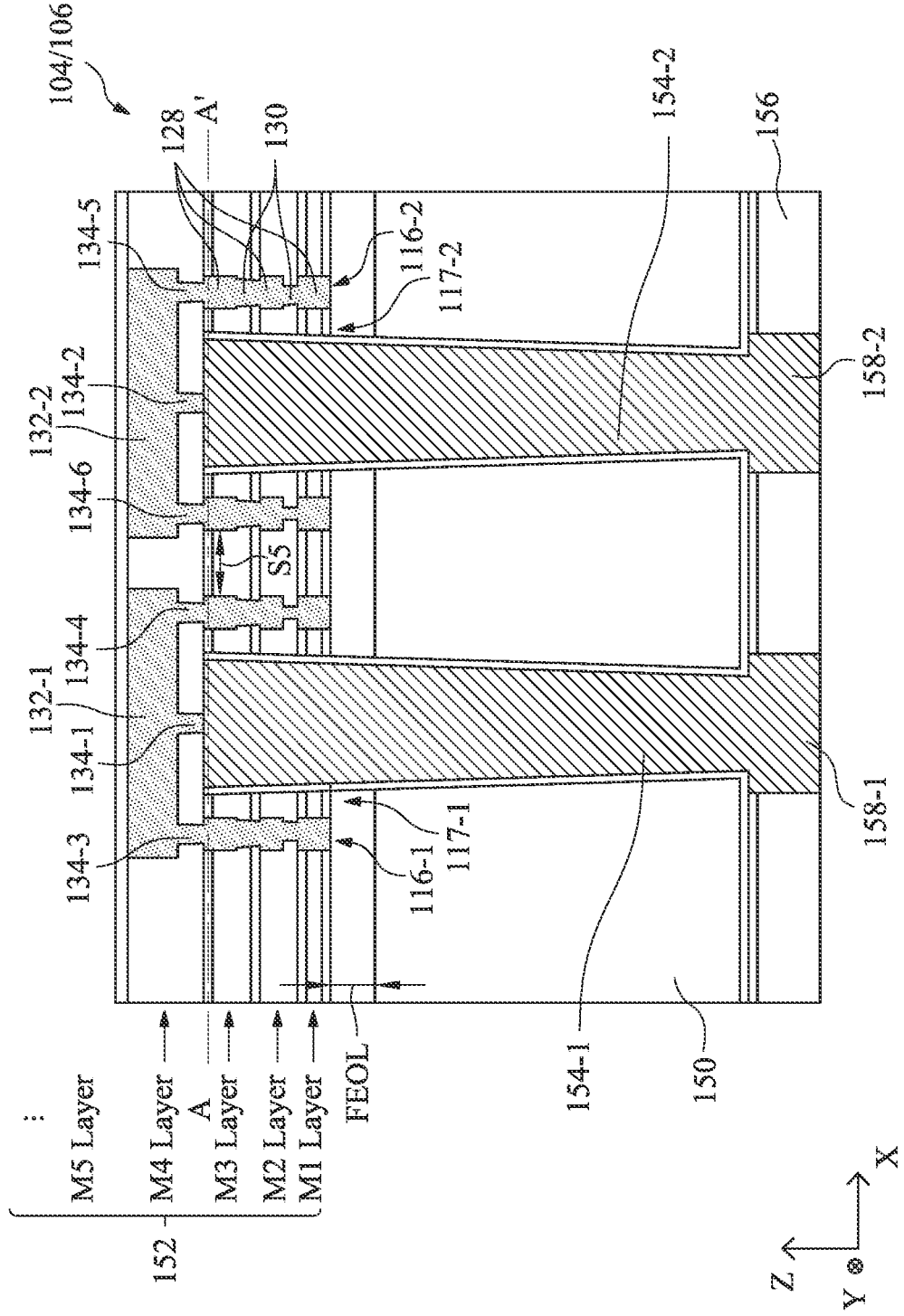
FIG. 4A is a cross-sectional diagram illustrating an example guard ring design in accordance with some embodiments.
Figure 4B:
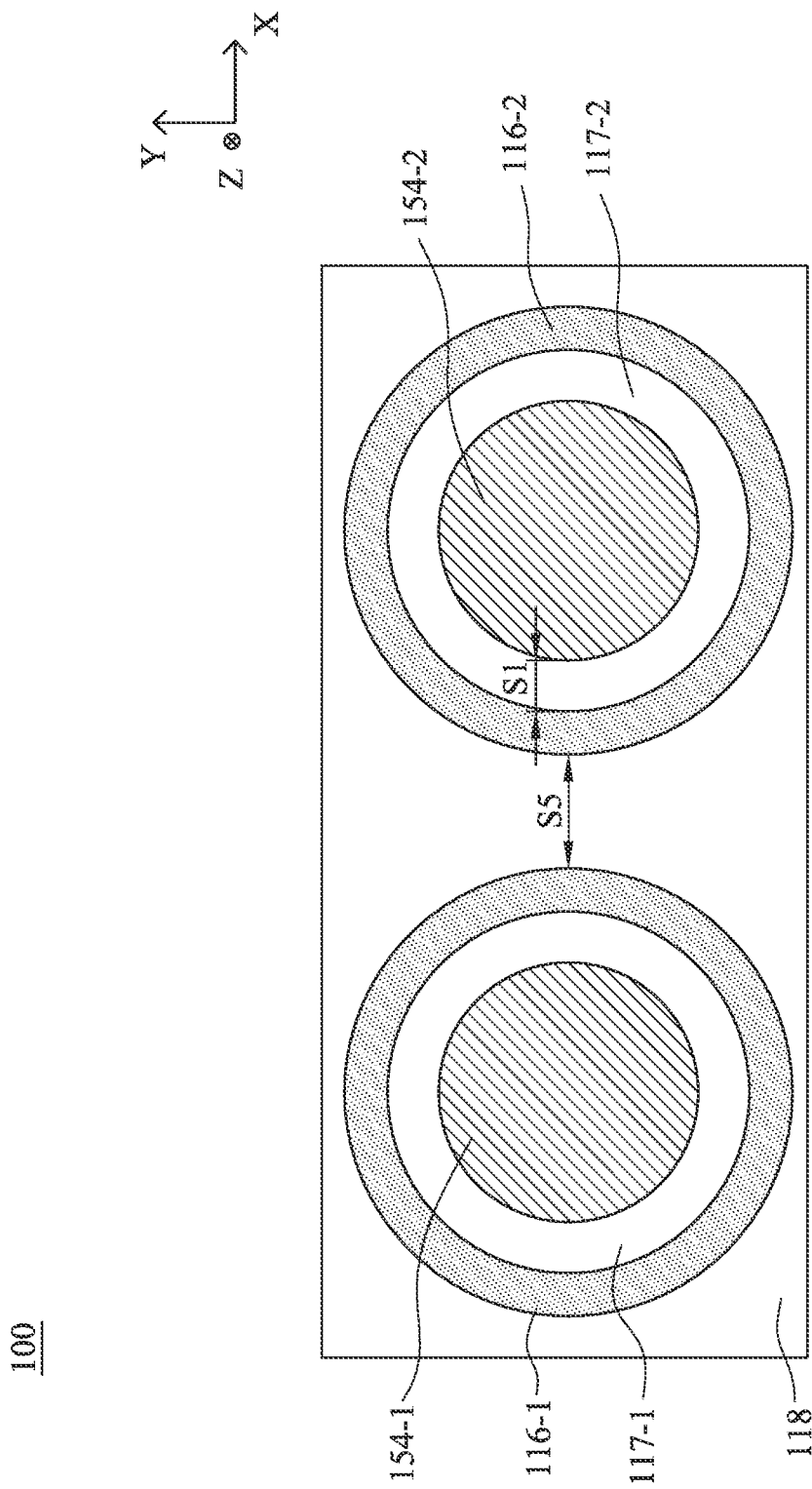
FIG. 4B is a cross-sectional diagram illustrating the example guard ring design of FIG. 4A at a horizontal plane in accordance with some embodiments.

FIG. 4A is a cross-sectional diagram illustrating an example guard ring design in accordance with some embodiments. FIG. 4B is a cross-sectional diagram illustrating the example guard ring design of FIG. 4A at a horizontal plane in accordance with some embodiments. It should be understood that FIGS. 4A-4B are illustrative and not drawn to scale.

As shown in FIG. 4A, a first TSV 154-1 and a second TSV 154-2 are formed in a bottom die 104 or a top die 106. The first TSV 154-1 and the second TSV 154-2 penetrate the silicon substrate 150 and a portion of an MLI structure 152 in the vertical direction (i.e., the Z-direction). One end of the first TSV 154-1 is in contact with and electrically connected to a hybrid bonding metal pad 158-1 in a bonding layer 156 formed at the backside of the silicon substrate 150, the other end of the first TSV 154-1 is in contact with and electrically connected to a via 134-1 formed in the M4 layer. Similarly, One end of the second TSV 154-2 is in contact with and electrically connected to a hybrid bonding metal pad 158-2 in the bonding layer 156, the other end of the second TSV 154-2 is in contact with and electrically connected to a via 134-2 formed in the M4 layer.

Different from the example shown in FIG. 3, the guard ring 116-1 and the guard ring 116-2 are separated by a guard ring gap S5 in the X-direction. That is, the guard ring 116-1 and the guard ring 116-2 do not have any shared region.

The first guard ring 116-1 is electrically connected to the metal track 132-1 through two vias 134-3 and 134-4, the second guard ring 116-2 is electrically connected to the metal track 132-2 through two vias 134-5 and 134-6. As the first TSV 154-1 and the first guard ring 116-1 are both electrically connected to the metal track 132-1, the potential of the first TSV 154-1 is the same as the potential of the first guard ring 116-1, eliminating the inductive capacitance between the first TSV 154-1 and the first guard ring 116-1. Likewise, as the second TSV 154-2 and the second guard ring 116-2 are both electrically connected to the metal track 132-2, the potential of the second TSV 154-2 is the same as the potential of the second guard ring 116-2, eliminating the inductive capacitance between the second TSV 154-2 and the second guard ring 116-2.

As shown in FIG. 4B, which illustrates a cross-section taken at a horizontal plane (denoted as A-A' in FIG. 4A), the first TSV 154-1 is surrounded by the first guard ring 116-1, while the second TSV 154-2 is surrounded by the second guard ring 116-2. The first TSV 154-1, the second TSV 154-2, the first guard ring 116-1, and the second guard ring 116-2 are located in the dielectric layer 118. The dielectric between the first TSV 154-1 and the first guard ring 116-1 is considered as a first buffer ring 117-1, while the dielectric between the second TSV 154-2 and the second guard ring 116-2 is considered as a second buffer ring 117-2. In one embodiment, the first buffer ring 117-1 and the second buffer ring 117-2 are made of an ELK dielectric (relative to silicon dioxide) having a dielectric constant of about 2.6 or less.

In the example shown in FIG. 4B, the first guard ring 116-1 and the second guard ring 116-2 are separated by the guard ring gap S5 in the X-direction. Due to the inductive capacitance between the neighboring edges of the first guard ring 116-1 and the second guard ring 116-2, S5 cannot be too small. In one embodiment, S5 is larger than S1 (i.e., the critical dimension of the buffer ring 117-1 and the buffer ring 117-2). In another embodiment, S5 is larger than 0.2 μm. In another embodiment, S5 is larger than 0.15 μm.

Figure 5A:
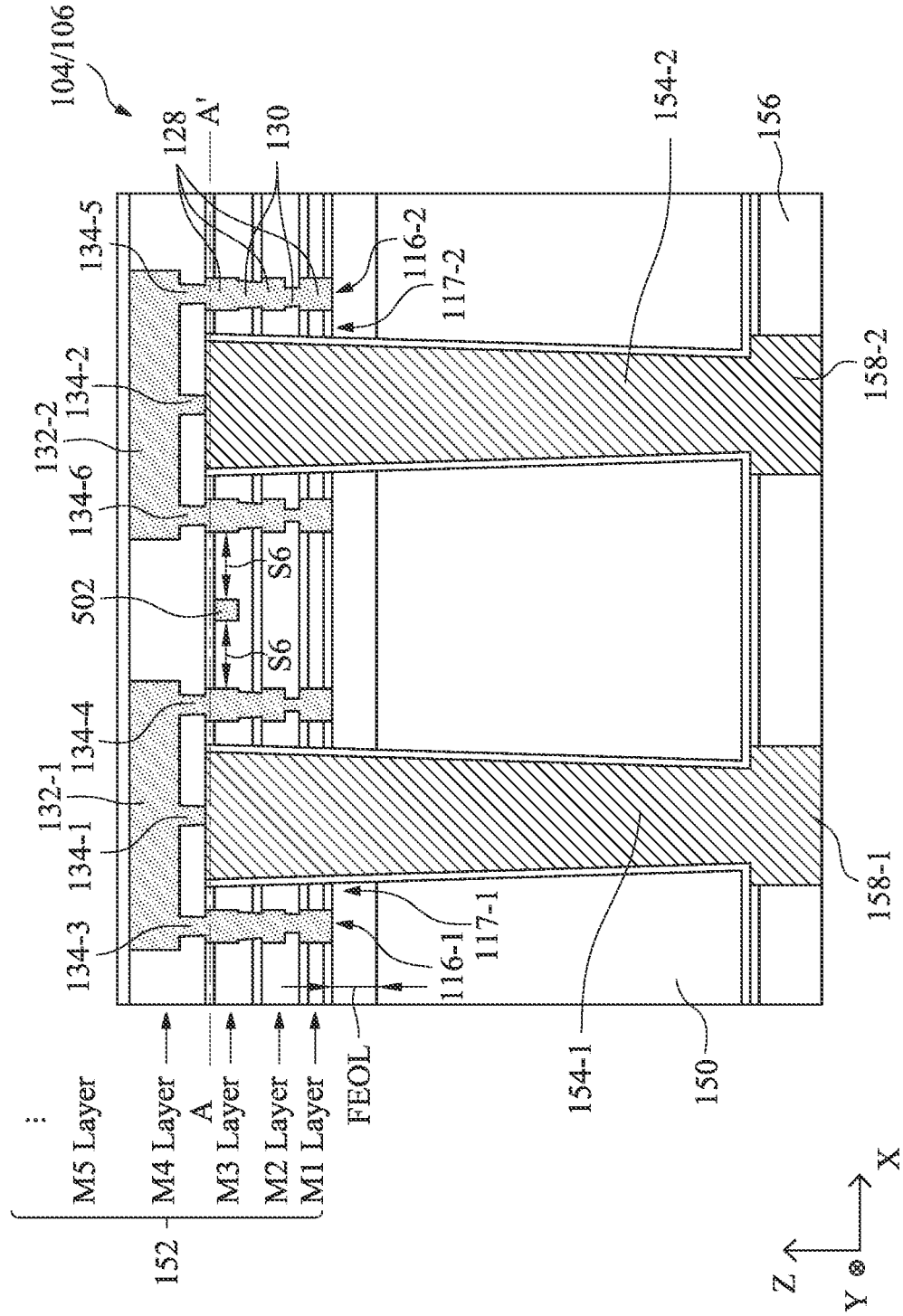
FIG. 5A is a cross-sectional diagram illustrating an example guard ring design in accordance with some embodiments.
Figure 5B:
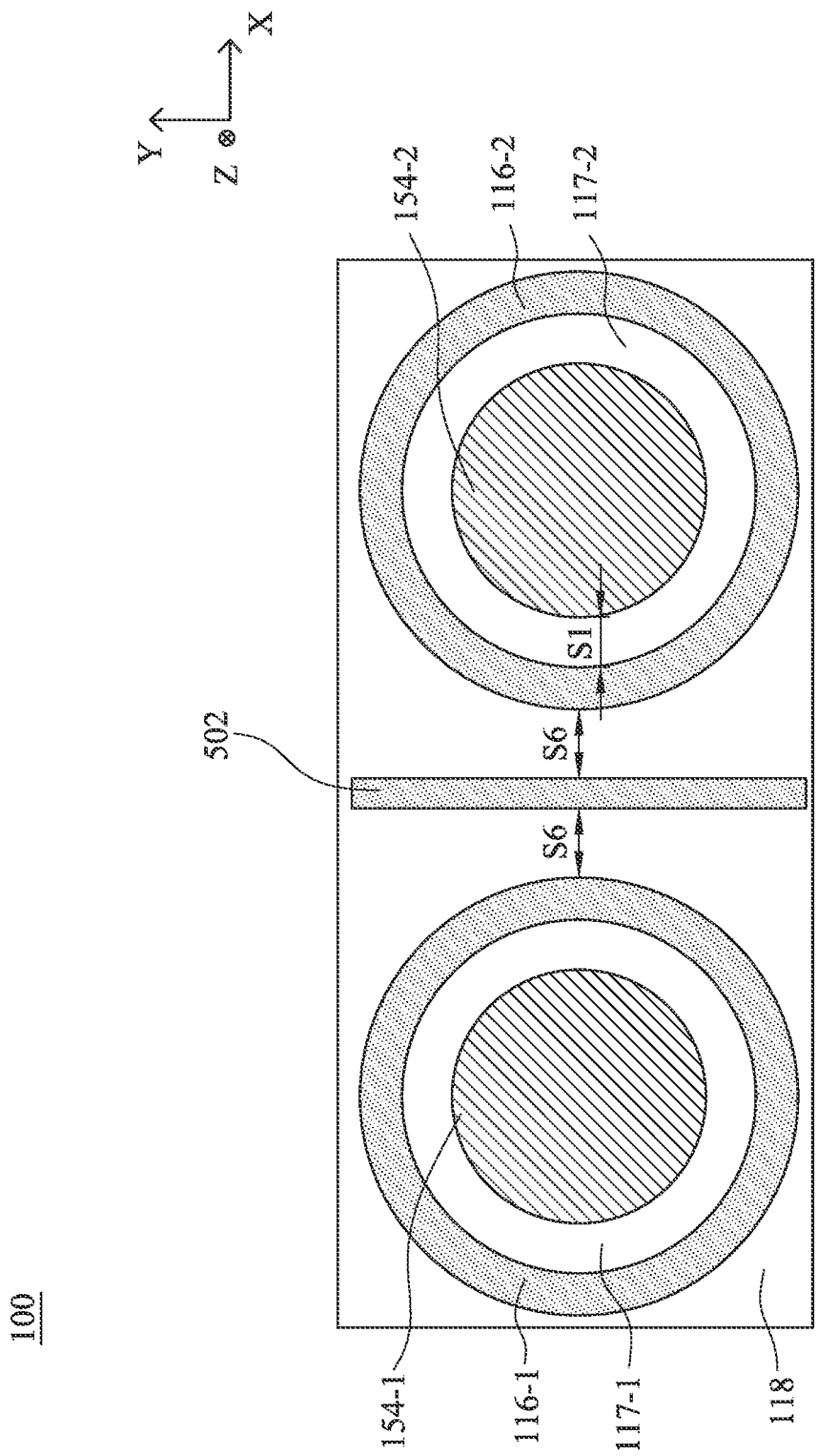
FIG. 5B is a cross-sectional diagram illustrating the example guard ring design of FIG. 5A at a horizontal plane in accordance with some embodiments.

FIG. 5A is a cross-sectional diagram illustrating an example guard ring design in accordance with some embodiments. FIG. 5B is a cross-sectional diagram illustrating the example guard ring design of FIG. 5A at a horizontal plane in accordance with some embodiments. It should be understood that FIGS. 5A-5B are illustrative and not drawn to scale.

As shown in FIG. 5A, a first TSV 154-1 and a second TSV 154-2 are formed in a bottom die 104 or a top die 106. The first TSV 154-1 and the second TSV 154-2 penetrate the silicon substrate 150 and a portion of an MLI structure 152 in the vertical direction (i.e., the Z-direction). One end of the first TSV 154-1 is in contact with and electrically connected to a hybrid bonding metal pad 158-1 in a bonding layer 156 formed at the backside of the silicon substrate 150, the other end of the first TSV 154-1 is in contact with and electrically connected to a via 134-1 formed in the M4 layer. Similarly, One end of the second TSV 154-2 is in contact with and electrically connected to a hybrid bonding metal pad 158-2 in the bonding layer 156, the other end of the second TSV 154-2 is in contact with and electrically connected to a via 134-2 formed in the M4 layer.

The first guard ring 116-1 is electrically connected to the metal track 132-1 through two vias 134-3 and 134-4, the second guard ring 116-2 is electrically connected to the metal track 132-2 through two vias 134-5 and 134-6. As the first TSV 154-1 and the first guard ring 116-1 are both electrically connected to the metal track 132-1, the potential of the first TSV 154-1 is the same as the potential of the first guard ring 116-1, eliminating the inductive capacitance between the first TSV 154-1 and the first guard ring 116-1. Likewise, as the second TSV 154-2 and the second guard ring 116-2 are both electrically connected to the metal track 132-2, the potential of the second TSV 154-2 is the same as the potential of the second guard ring 116-2, eliminating the inductive capacitance between the second TSV 154-2 and the second guard ring 116-2.

Different from the example shown in FIG. 4A, the guard ring 116-1 and the guard ring 116-2 are separated by a separating metal track 502 in the X-direction. The separating metal track 502 is formed in the M3 layer and extends in the Y-direction. In one embodiment, the separating metal track 502 is a dummy metal track between the first guard ring 116-1 and the second guard ring 116-2, and the dummy metal track is not electrically connected to any semiconductor devices in the bottom die 104 or the top die 106. The separating metal track 502, which is a dummy metal track, may serve at least one of the following functions: (i) eliminating cross-talk between the first TSV 154-1 and the second TSV 154-2; and (ii) mitigating the dishing effects during chemical mechanical planarization (CMP) of the copper structures. Due to the dishing effects, a difference in height between the center of the copper line and the point where the dielectric levels off exists. By introducing the separating metal track 502 as a dummy metal track in the middle between the first guard ring 116-1 and the second guard ring 116-2, the dishing defects can be mitigated.

In other embodiments, the separating metal track 502 can be electrically connected to semiconductor devices or circuits located in the bottom die 104 or the top die 106 and used for routing signals or grounding, etc.

As shown in FIG. 5B, which illustrates a cross-section taken at a horizontal plane (denoted as A-A' in FIG. 5A), the first TSV 154-1 is surrounded by the first guard ring 116-1, while the second TSV 154-2 is surrounded by the second guard ring 116-2. The first TSV 154-1, the second TSV 154-2, the first guard ring 116-1, and the second guard ring 116-2 are located in the dielectric layer 118. The dielectric between the first TSV 154-1 and the first guard ring 116-1 is considered as a first buffer ring 117-1, while the dielectric between the second TSV 154-2 and the second guard ring 116-2 is considered as a second buffer ring 117-2. In one embodiment, the first buffer ring 117-1 and the second buffer ring 117-2 are made of an ELK dielectric (relative to silicon dioxide) having a dielectric constant of about 2.6 or less.

In the example shown in FIG. 5B, the first guard ring 116-1 and the second guard ring 116-2 are separated by the separating metal track 502 extending in the Y-direction. The distance in the X-direction between the separating metal track 502 and the first guard ring 116-1 or the second guard ring 116-2 is S6. Due to the inductive capacitance between the edges of the first guard ring 116-1 and the second guard ring 116-2 and the separating metal track 502, S6 cannot be too small. In one embodiment, S6 is larger than S1 (i.e., the critical dimension of the buffer ring 117-1 and the buffer ring 117-2). In another embodiment, S6 is larger than 0.2 μm. In another embodiment, S6 is larger than 0.15 μm.

Figure 6:
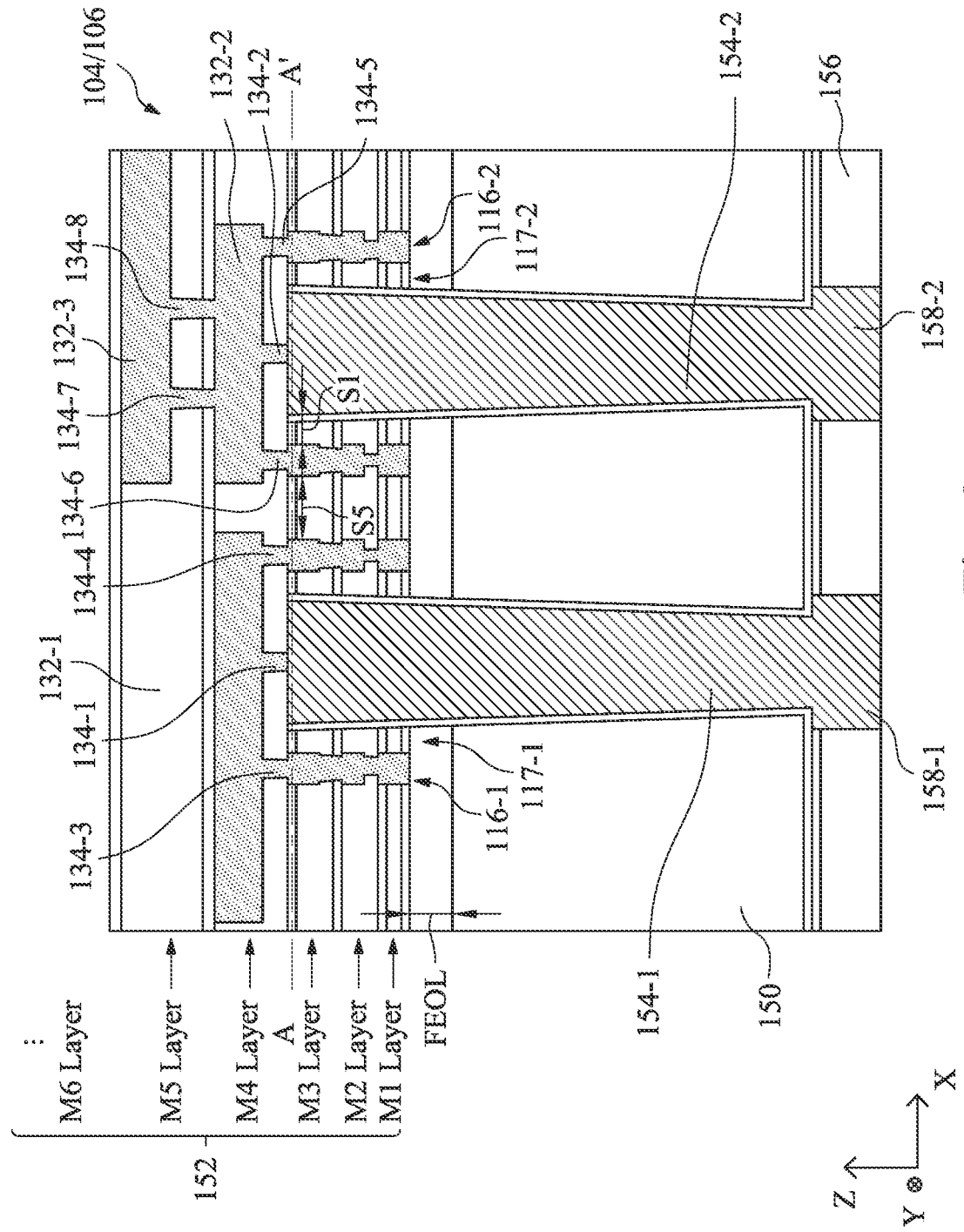
FIG. 6 is a cross-sectional diagram illustrating an example guard ring design in accordance with some embodiments.

FIG. 6 is a cross-sectional diagram illustrating an example guard ring design in accordance with some embodiments. It should be understood that FIG. 6 is illustrative and not drawn to scale.

As shown in FIG. 6, a first TSV 154-1 and a second TSV 154-2 are formed in a bottom die 104 or a top die 106. The first TSV 154-1 and the second TSV 154-2 penetrate the silicon substrate 150 and a portion of an MLI structure 152 in the vertical direction (i.e., the Z-direction). One end of the first TSV 154-1 is in contact with and electrically connected to a hybrid bonding metal pad 158-1 in a bonding layer 156 formed at the backside of the silicon substrate 150, the other end of the first TSV 154-1 is in contact with and electrically connected to a via 134-1 formed in the M4 layer. Similarly, One end of the second TSV 154-2 is in contact with and electrically connected to a hybrid bonding metal pad 158-2 in the bonding layer 156, the other end of the second TSV 154-2 is in contact with and electrically connected to a via 134-2 formed in the M4 layer.

The first guard ring 116-1 is electrically connected to the metal track 132-1 through two vias 134-3 and 134-4. Different from the example shown in FIG. 4A, the second guard ring 116-2 is electrically connected to the metal track 132-2 through two vias 134-5 and 134-6, and the metal track 132-2 formed in the M4 layer is further electrically connected to a metal track 132-3 formed in the M5 layer. In other words, metal tracks in two or more metal layers (the M4 layer and the M5 layer in this example) can be used, therefore avoiding circuit design restrictions by utilizing more routing resources in two or more metal layers.

As the first TSV 154-1 and the first guard ring 116-1 are both electrically connected to the metal track 132-1, the potential of the first TSV 154-1 is the same as the potential of the first guard ring 116-1, eliminating the inductive capacitance between the first TSV 154-1 and the first guard ring 116-1. Likewise, as the second TSV 154-2 and the second guard ring 116-2 are both electrically connected to the metal track 132-2, the potential of the second TSV 154-2 is the same as the potential of the second guard ring 116-2, eliminating the inductive capacitance between the second TSV 154-2 and the second guard ring 116-2.

Similar to the example shown in FIG. 4A, the guard ring 116-1 and the guard ring 116-2 are separated by a guard ring gap S5 in the X-direction. Due to the inductive capacitance between the neighboring edges of the first guard ring 116-1 and the second guard ring 116-2, S5 cannot be too small. In one embodiment, S5 is larger than S1 (i.e., the critical dimension of the buffer ring 117-1 and the buffer ring 117-2). In another embodiment, S5 is larger than 0.2 μm. In another embodiment, S5 is larger than 0.15 μm.

Likewise, the first guard ring 116-1 is electrically connected to the metal track 132-1 through two vias 134-3 and 134-4, the second guard ring 116-2 is electrically connected to the metal track 132-2 through two vias 134-5 and 134-6. As the first TSV 154-1 and the first guard ring 116-1 are both electrically connected to the metal track 132-1, the potential of the first TSV 154-1 is the same as the potential of the first guard ring 116-1, eliminating the inductive capacitance between the first TSV 154-1 and the first guard ring 116-1. Likewise, as the second TSV 154-2 and the second guard ring 116-2 are both electrically connected to the metal track 132-2 and the metal track 132-3, the potential of the second TSV 154-2 is the same as the potential of the second guard ring 116-2, eliminating the inductive capacitance between the second TSV 154-2 and the second guard ring 116-2.

Figure 7:
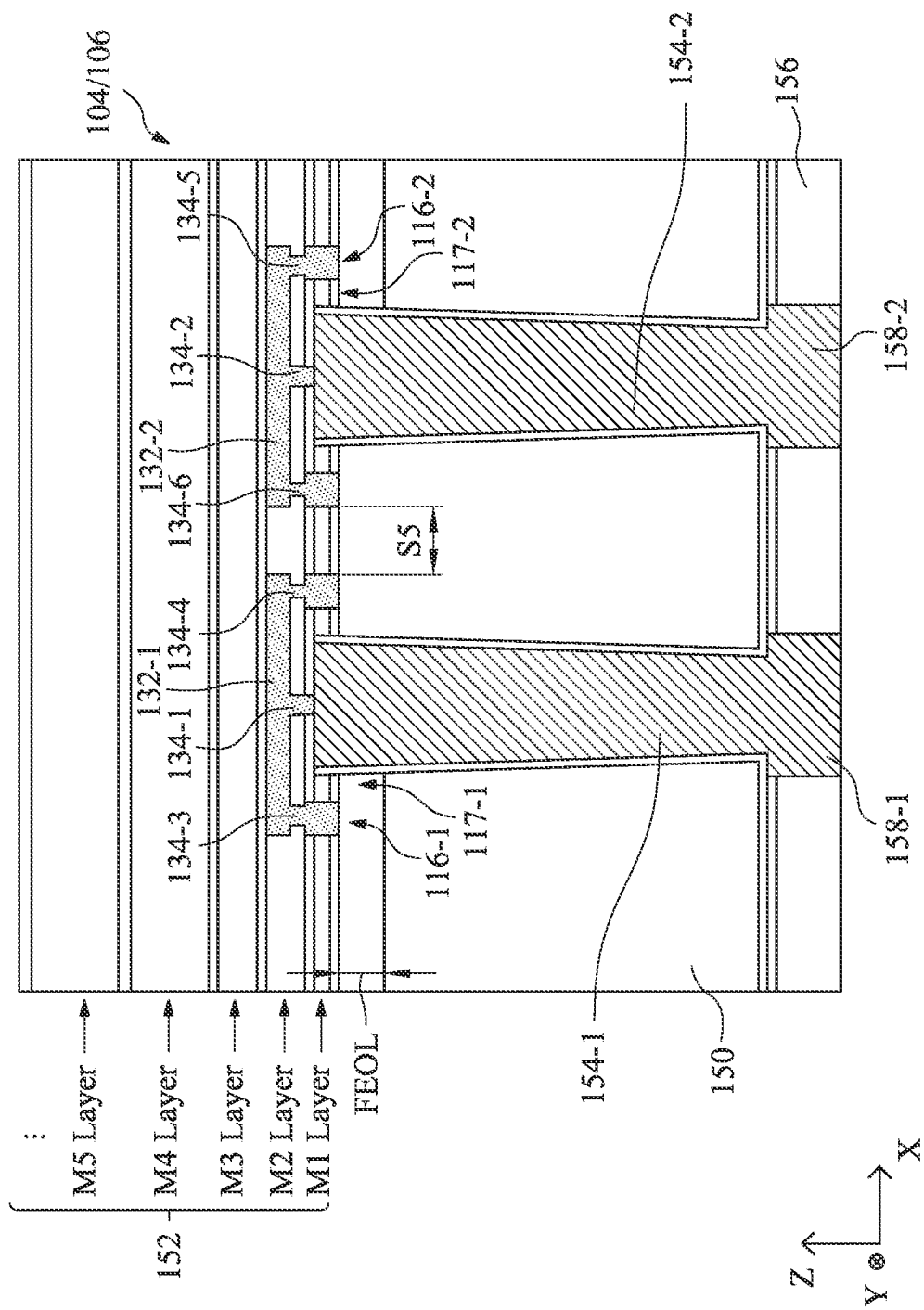
FIG. 7 is a cross-sectional diagram illustrating an example guard ring design in accordance with some embodiments.

FIG. 7 is a cross-sectional diagram illustrating an example guard ring design in accordance with some embodiments. It should be understood that FIG. 7 is illustrative and not drawn to scale. The example shown in FIG. 7 is identical to the example shown in FIG. 4A except that the metal track 132-1 and the metal track 132-2 are formed in the M2 layer, which is one layer above the top layer where the first TSV 154-1 and the second TSV 154-2 penetrate through or formed in (i.e., the M1 layer). It should be understood that the techniques disclosed herein are generally applicable to any layer configurations. For example, when the top layer where the first TSV 154-1 and the second TSV 154-2 penetrate through or formed in is the tenth metal layer (i.e., the "M10 layer"), then the metal tracks 132-1 and 132-2 are formed in the eleventh metal layer (i.e., the "M11 layer").

Figure 8A:
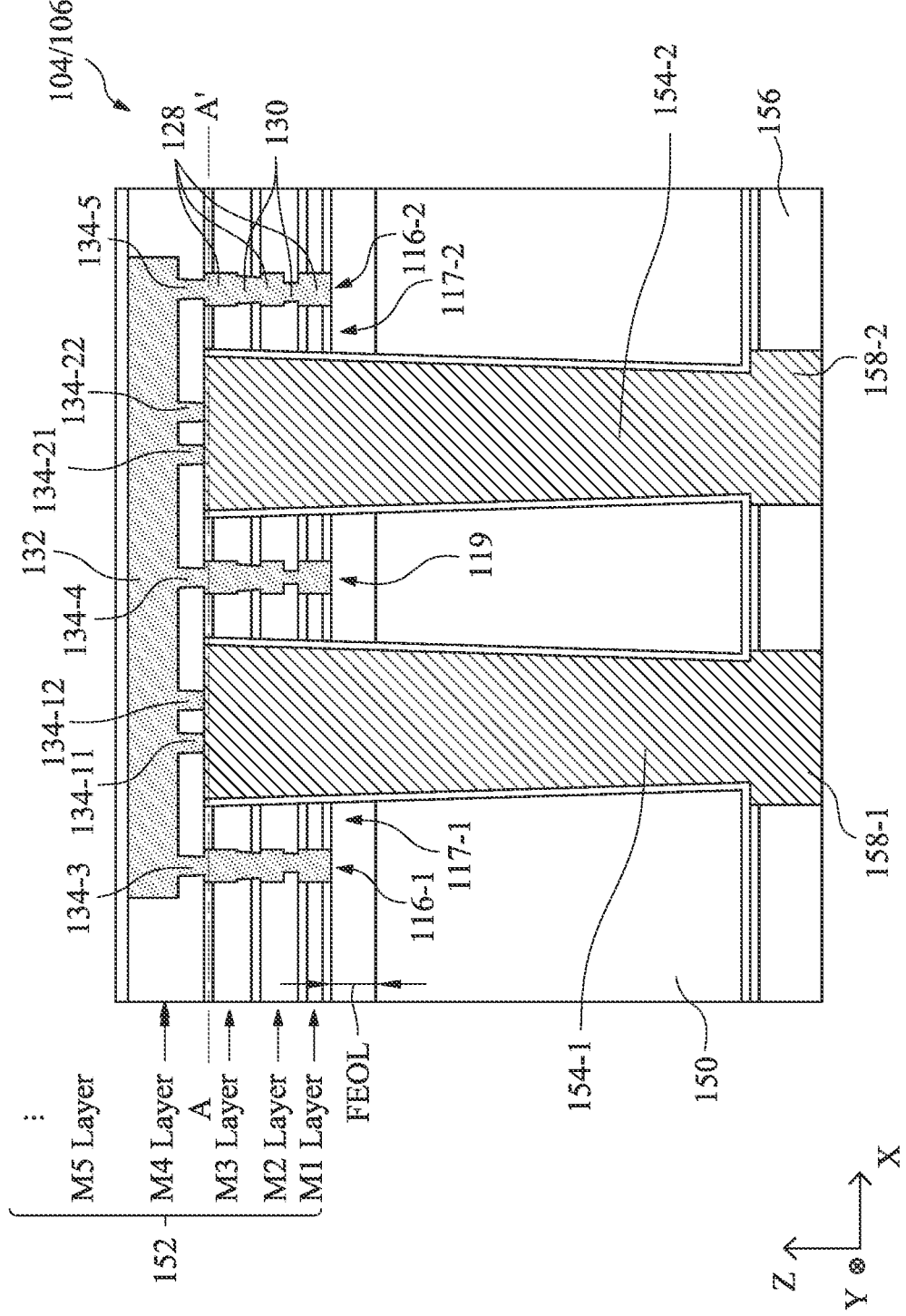
FIG. 8A is a cross-sectional diagram illustrating an example guard ring design in accordance with some embodiments.
Figure 8B:
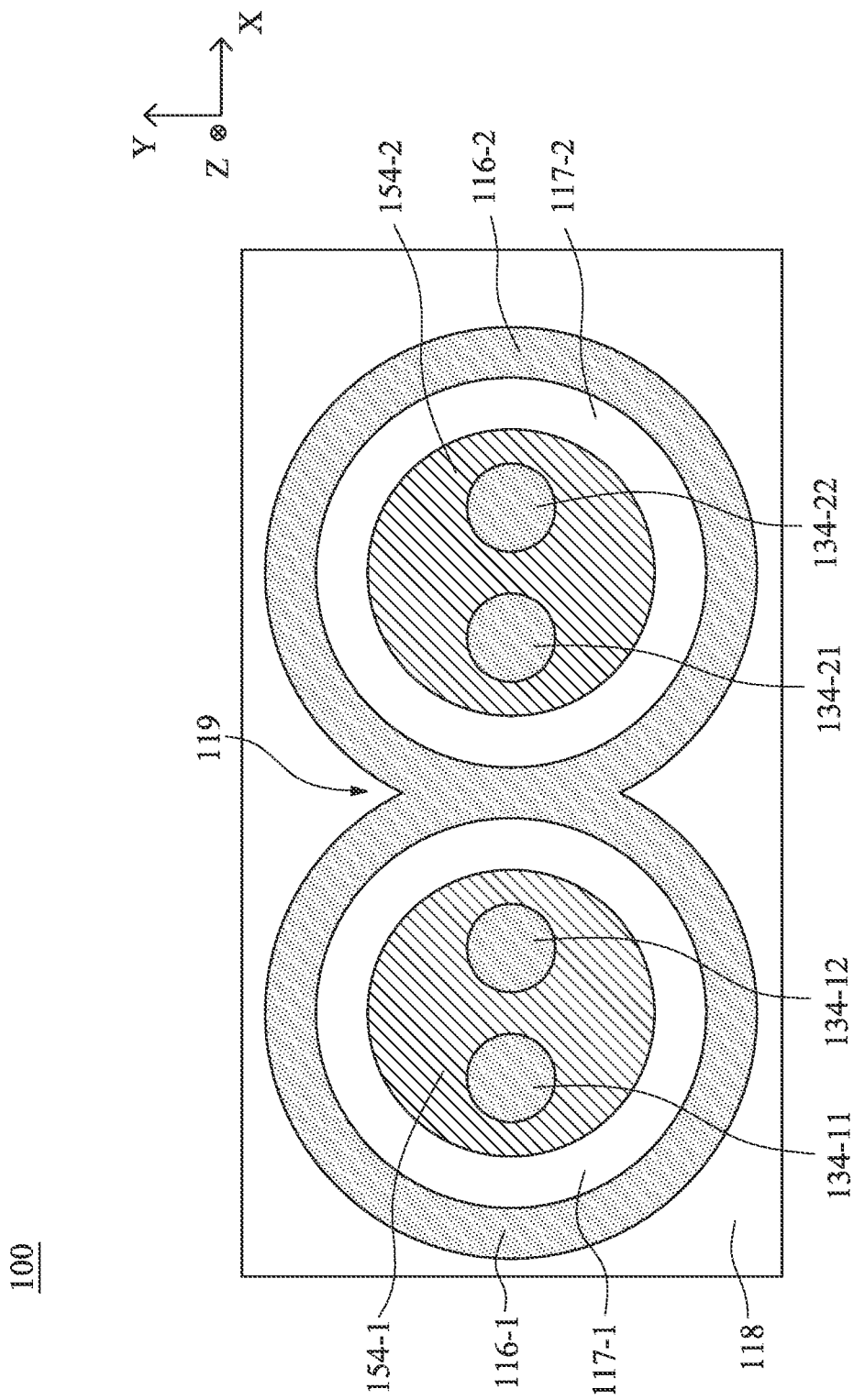
FIG. 8B is a cross-sectional diagram illustrating the example guard ring design of FIG. 8A at a horizontal plane in accordance with some embodiments.

FIG. 8A is a cross-sectional diagram illustrating an example guard ring design in accordance with some embodiments. FIG. 8B is a cross-sectional diagram illustrating the example guard ring design of FIG. 8A at a horizontal plane in accordance with some embodiments. It should be understood that FIGS. 8A-8B are illustrative and not drawn to scale.

The example shown in FIGS. 8A-8B is identical to the example shown in FIG. 3 except that two vias, instead of one via, are used for electrically connecting the first TSV 154-1 or the second TSV 154-2 to the metal track 132. As a result, the resistance can be reduced.

As shown in FIGS. 8A and 8B, one end of the first TSV 154-1 is in contact with and electrically connected to a hybrid bonding metal pad 158-1 in a bonding layer 156 formed at the backside of the silicon substrate 150, the other end of the first TSV 154-1 is in contact with and electrically connected to two vias 134-11 and 134-12 formed in the M4 layer. The vias 134-11 and 134-12 are further in contact with and electrically connected to a metal track 132 formed in the M4 layer. Because two vias 134-11 and 134-12 connected in parallel are used, the overall resistance is reduced.

Similarly, one end of the second TSV 154-2 is in contact with and electrically connected to a hybrid bonding metal pad 158-2 in the bonding layer 156, the other end of the second TSV 154-2 is in contact with and electrically connected to two vias 134-21 and 134-22 formed in the M4 layer. The vias 134-21 and 134-22 are further in contact with and electrically connected to the metal track 132. Because two vias 134-21 and 134-22 connected in parallel are used, the overall resistance is reduced.

As shown in FIG. 8B, the two vias 134-11 and 134-12 or the two vias 134-21 and 134-22 are in a circular shape. It should be understood that other numbers (e.g., three, four, six, etc.) of vias, other via shapes (e.g., square, etc.), or other via sizes (e.g., larger than the size shown in FIG. 8B) can be employed.

Figure 9B:
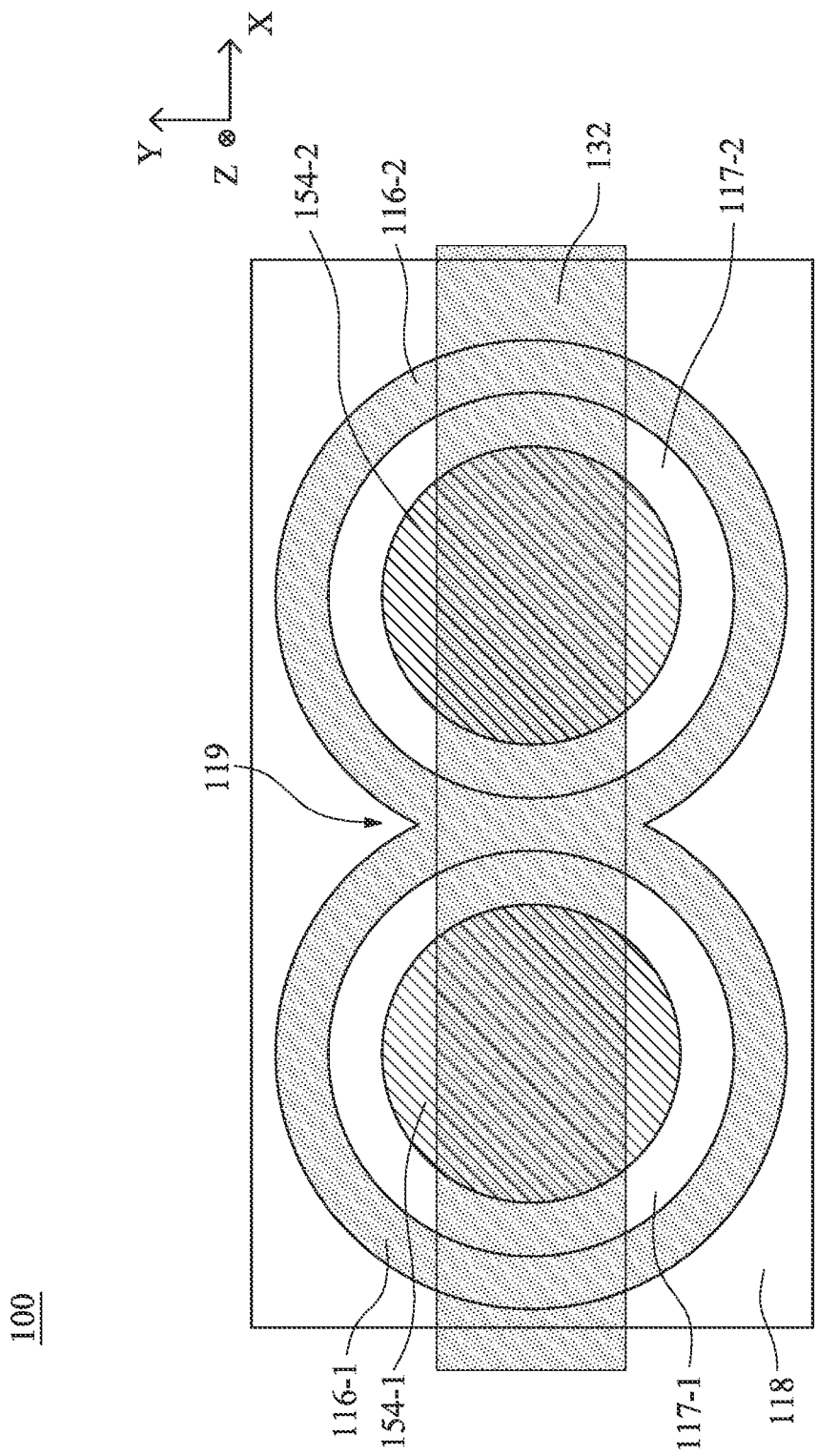
FIG. 9B is a cross-sectional diagram illustrating the example guard ring design of FIG. 9A at a horizontal plane in accordance with some embodiments.

FIG. 9A is a cross-sectional diagram illustrating an example guard ring design in accordance with some embodiments. FIG. 9B is a cross-sectional diagram illustrating the example guard ring design of FIG. 9A at a horizontal plane in accordance with some embodiments. It should be understood that FIGS. 9A-9B are illustrative and not drawn to scale.

The example shown in FIGS. 9A-9B is identical to the example shown in FIG. 3 except that the first TSV 154-1 and the second TSV 154-2 are directly in contact with the metal track 132. That is, the vias 134-1 and 134-2 in the example shown in FIG. 3 are not used. Instead, the top surface of the first TSV 154-1 and the top surface of the second TSV 154-2 are formed in the middle of the M4 layer, such that the top surface of the first TSV 154-1 and the top surface of the second TSV 154-2 are in direct contact with the bottom surface of the metal track 132.

As shown in FIG. 8B, the metal track 132 is directly in contact with the first TSV 154-1 and the second TSV 154-2. Since the contact area between the metal track 132 and the first TSV 154-1 and the second TSV 154-2 is larger than that in the example shown in FIG. 3, the overall resistance is reduced.

FIG. 10 is a diagram illustrating an example guard ring design in accordance with some embodiments. In the example shown in FIG. 10, two TSV regions 1002 and 1004 are located in the X-Y plane of a bottom die 104 or a top die 106. Each of the TSV regions 1002 and 1004 includes multiple TSVs 154 and corresponding guard ring 161. The guard rings 161 can have the designs mentioned above with reference to FIGS. 2A-9B in various embodiments. It should be understood that various TSV region numbers (e.g., three, four, etc.), various TSV region shapes (e.g., square, etc.), and various TSV region sizes can be employed.

The overall area of TSVs 154 cannot be too large. Otherwise, the copper under-fill issue during the copper electroplating process will become a concern. In one embodiment, the overall TSV area is smaller than 40% of the overall die area. In another embodiment, the overall TSV area is smaller than 35% of the overall die area. In yet another embodiment, the overall TSV area is smaller than 33% of the overall die area.

In accordance with some aspects of the disclosure, a semiconductor die is provided. The semiconductor die includes: a silicon substrate; a bonding layer formed at a back side of the silicon substrate and including a first metal pad; a multi-layer interconnect (MLI) structure formed at a front side of the silicon substrate; a first through-silicon via (TSV) penetrating the silicon substrate and at least a portion of the MLI structure in a vertical direction, wherein a first end of the first TSV is in contact with and electrically connected to the first metal pad, and a second end of the first TSV is electrically connected to a first metal track located in the MLI structure; and a first guard ring formed in the MLI structure, wherein the first guard ring extends in the vertical direction and surrounds the first TSV, and the first guard ring is electrically connected to the first metal track.

In accordance with some aspects of the disclosure, a semiconductor die is provided. The semiconductor die includes: a silicon substrate; a bonding layer formed at a back side of the silicon substrate and including a first metal pad and a second metal pad; a multi-layer interconnect (MLI) structure formed at a front side of the silicon substrate; a first through-silicon via (TSV) penetrating the silicon substrate and at least a portion of the MLI structure in a vertical direction, wherein a first end of the first TSV is in contact with and electrically connected to the first metal pad, and a second end of the first TSV is electrically connected to a metal track located in the MLI structure; a first guard ring formed in the MLI structure, wherein the first guard ring extends in the vertical direction and surrounds the first TSV; a second TSV penetrating the silicon substrate and at least a portion of the MLI structure in the vertical direction, wherein a first end of the second TSV is in contact with and electrically connected to a second metal pad formed in the bonding layer, and a second end of the second TSV is electrically connected to the metal track located in the MLI structure; and a second guard ring formed in the MLI structure, wherein the second guard ring extends in the vertical direction and surrounds the second TSV, and the first guard ring and the second guard ring have a shared region.

In accordance with some aspects of the disclosure, a semiconductor die. The semiconductor die includes: a silicon substrate; a bonding layer formed at a back side of the silicon substrate and including a first metal pad and a second metal pad; a multi-layer interconnect (MLI) structure formed at a front side of the silicon substrate; a first through-silicon via (TSV) penetrating the silicon substrate and at least a portion of the MLI structure in a vertical direction, wherein a first end of the first TSV is in contact with and electrically connected to the first metal pad, and a second end of the first TSV is electrically connected to a first metal track located in the MLI structure; a first guard ring formed in the MLI structure, wherein the first guard ring extends in the vertical direction and surrounds the first TSV, and the first guard ring is electrically connected to the first metal track; a second TSV penetrating the silicon substrate and at least a portion of the MLI structure in the vertical direction, wherein a first end of the second TSV is in contact with and electrically connected to a second metal pad formed in the bonding layer, and a second end of the second TSV is electrically connected to a second metal track located in the MLI structure; and a second guard ring formed in the MLI structure, wherein the second guard ring extends in the vertical direction and surrounds the second TSV, and the second guard ring is electrically connected to the second metal track, and wherein the first guard ring and the second guard ring are separated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die comprising:
   a silicon substrate;
   a seal ring formed at a front side of the silicon substrate and separating a central region of the silicon substrate and a peripheral region of the silicon substrate surrounding the central region of the silicon substrate;
   a bonding layer formed at a back side of the silicon substrate and including a first metal pad;
   a multi-layer interconnect (MLI) structure formed at the front side of the silicon substrate;
   a first through-silicon via (TSV) vertically penetrating the central region of the silicon substrate and at least a portion of the MLI structure in a vertical direction, wherein a first end of the first TSV is in contact with and electrically connected to the first metal pad, and a second end of the first TSV is electrically connected to a first metal track located in the MLI structure; and
   a first guard ring formed in the MLI structure, wherein the first guard ring extends in the vertical direction and surrounds the first TSV, and the first guard ring is electrically connected to the first metal track.

2. The semiconductor die of claim 1 further comprising:
   a first buffer ring between the first guard ring and the first TSV.

3. The semiconductor die of claim 2, wherein a diameter of the first TSV is larger than a thickness of the first buffer ring.

4. The semiconductor die of claim 3, further comprising:
   a second TSV penetrating the silicon substrate and at least a portion of the MLI structure in the vertical direction, wherein a first end of the second TSV is in contact with and electrically connected to a second metal pad formed in the bonding layer, and a second end of the second TSV is electrically connected to a second metal track located in the MLI structure; and
   a second guard ring formed in the MLI structure, wherein the second guard ring extends in the vertical direction and surrounds the second TSV, and the second guard ring is electrically connected to the second metal track.

5. The semiconductor die of claim 4 further comprising: a second buffer ring between the second guard ring and the second TSV.

6. The semiconductor die of claim 5, wherein the first metal track is the second metal track.

7. The semiconductor die of claim 6, wherein the first guard ring and the second guard ring have a shared region.

8. The semiconductor die of claim 7, wherein the first TSV is electrically connected to the first metal track through one via.

9. The semiconductor die of claim 7, wherein the first TSV is electrically connect to the first metal track through two or more vias.

10. The semiconductor die of claim 7, wherein the first TSV is directly in contact with the first metal track.

11. The semiconductor die of claim 5, wherein the first guard ring and the second guard ring are separated by a guard ring gap.

12. The semiconductor die of claim 11, wherein the guard ring gap is larger than the thickness of the first buffer ring.

13. The semiconductor die of claim 5, wherein the first guard ring and the second guard ring are separated by a separating metal track extending in a horizontal plane.

14. The semiconductor die of claim 13, wherein a distance between the first guard ring and the separating metal track is larger than the thickness of the first buffer ring.

15. The semiconductor die of claim 13, wherein the separating metal track is not electrically connected to any semiconductor devices formed in the semiconductor die.

16. The semiconductor die of claim 1, wherein the bonding layer is configured to bond the semiconductor die to a second semiconductor die using hybrid bonding.

17. A semiconductor die comprising:
a silicon substrate;
a bonding layer formed at a back side of the silicon substrate and including a first metal pad and a second metal pad;
a multi-layer interconnect (MLI) structure formed at a front side of the silicon substrate;
a first through-silicon via (TSV) penetrating the silicon substrate and at least a portion of the MLI structure in a vertical direction, wherein a first end of the first TSV is in contact with and electrically connected to the first metal pad, and a second end of the first TSV is electrically connected to a metal track located in the MLI structure;
a first guard ring formed in the MLI structure, wherein the first guard ring extends in the vertical direction and surrounds the first TSV;
a second TSV penetrating the silicon substrate and at least a portion of the MLI structure in the vertical direction, wherein a first end of the second TSV is in contact with and electrically connected to a second metal pad formed in the bonding layer, and a second end of the second TSV is electrically connected to the metal track located in the MLI structure; and
a second guard ring formed in the MLI structure, wherein the second guard ring extends in the vertical direction and surrounds the second TSV, and the first guard ring and the second guard ring have a shared region.

18. The semiconductor die of claim 17, wherein the first guard ring and the second guard ring are electrically connected to the metal track.

19. A semiconductor die comprising:
a silicon substrate;
a seal ring formed at a front side of the silicon substrate and separating a central region of the silicon substrate and a peripheral region of the silicon substrate surrounding the central region of the silicon substrate;
a bonding layer formed at a back side of the silicon substrate and including a first metal pad and a second metal pad;
a multi-layer interconnect (MLI) structure formed at the front side of the silicon substrate;
a first through-silicon via (TSV) vertically penetrating the central region of the silicon substrate and at least a portion of the MLI structure in a vertical direction, wherein a first end of the first TSV is in contact with and electrically connected to the first metal pad, and a second end of the first TSV is electrically connected to a first metal track located in the MLI structure;
a first guard ring formed in the MLI structure, wherein the first guard ring extends in the vertical direction and surrounds the first TSV, and the first guard ring is electrically connected to the first metal track;
a second TSV vertically penetrating the central region of the silicon substrate and at least a portion of the MLI structure in the vertical direction, wherein a first end of the second TSV is in contact with and electrically connected to a second metal pad formed in the bonding layer, and a second end of the second TSV is electrically connected to a second metal track located in the MLI structure; and
a second guard ring formed in the MLI structure, wherein the second guard ring extends in the vertical direction and surrounds the second TSV, and the second guard ring is electrically connected to the second metal track, and wherein the first guard ring and the second guard ring are separated.

20. The semiconductor die of claim 19, wherein the first guard ring and the second guard ring are separated by a separating metal track extending in a horizontal plane.

* * * * *